US005418750A

United States Patent [19]

Shiratake et al.

[11] Patent Number: 5,418,750
[45] Date of Patent: May 23, 1995

[54] SEMICONDUCTOR MEMORY DEVICE FOR SUPPRESSING NOISES OCCURRING ON BIT AND WORD LINES

[75] Inventors: Shinichiro Shiratake; Takehiro Hasegawa, both of Tokyo; Daisaburo Takashima; Ryu Ogiwara, both of Kawasaki; Ryo Fukuda, Yokohama, all of Japan

[73] Assignee: Kabushiki Kaisha Toshiba, Kawasaki, Japan

[21] Appl. No.: 200,107

[22] Filed: Feb. 22, 1994

[30] Foreign Application Priority Data

Feb. 22, 1993 [JP] Japan .................................. 5-032227
Sep. 14, 1993 [JP] Japan .................................. 5-228396

[51] Int. Cl.⁶ ............................................. G11C 7/00
[52] U.S. Cl. ...................................... 365/206; 365/63;
365/210; 365/51
[58] Field of Search ..................... 365/51, 52, 63, 72,
365/149, 190, 205–208, 210

[56] References Cited

U.S. PATENT DOCUMENTS

| 4,903,344 | 2/1990 | Inoue ....................... 365/51 |
| 5,051,954 | 9/1991 | Toda ..................... 365/149 X |
| 5,299,157 | 3/1994 | Kimura ................. 365/207 X |

OTHER PUBLICATIONS

IEEE Journal of Solid State Circuits, "A Blocked Oriented RAM with Half Sized DRAM Cell & Quasi Folded Data Line Architecture", vol. 26, No. 11, K. Kimura, et al. Nov. 1991, pp. 1511–1518.

*Primary Examiner*—Do Hyun Yoo
*Assistant Examiner*—Son Mai
*Attorney, Agent, or Firm*—Oblon, Spivak, McClelland, Maier & Neustadt

[57] ABSTRACT

A semiconductor memory device includes a series of memory cells, a series of bit lines respectively connected to the memory cells, a series of sense amplifiers, connected to corresponding bit line groups including predetermined number of bit lines of the series of bit lines, for reading out data of memory cells connected to bit lines of the bit line group, the bit line groups including at least adjacent first and second bit line groups, at least first and second transistors allocated between the bit lines and the sense amplifiers and having gates, for selectively connecting the bit lines and the sense amplifiers, and a series of control signal lines commonly connected to the first transistors connected to the first bit line groups and the second transistors connected to the second bit line groups, such that the first transistors connected to the first bit line groups are regularly arranged in one direction, and second transistors connected to the second bit line groups adjacent to the first bit line groups are regularly arranged in an opposite direction.

15 Claims, 19 Drawing Sheets

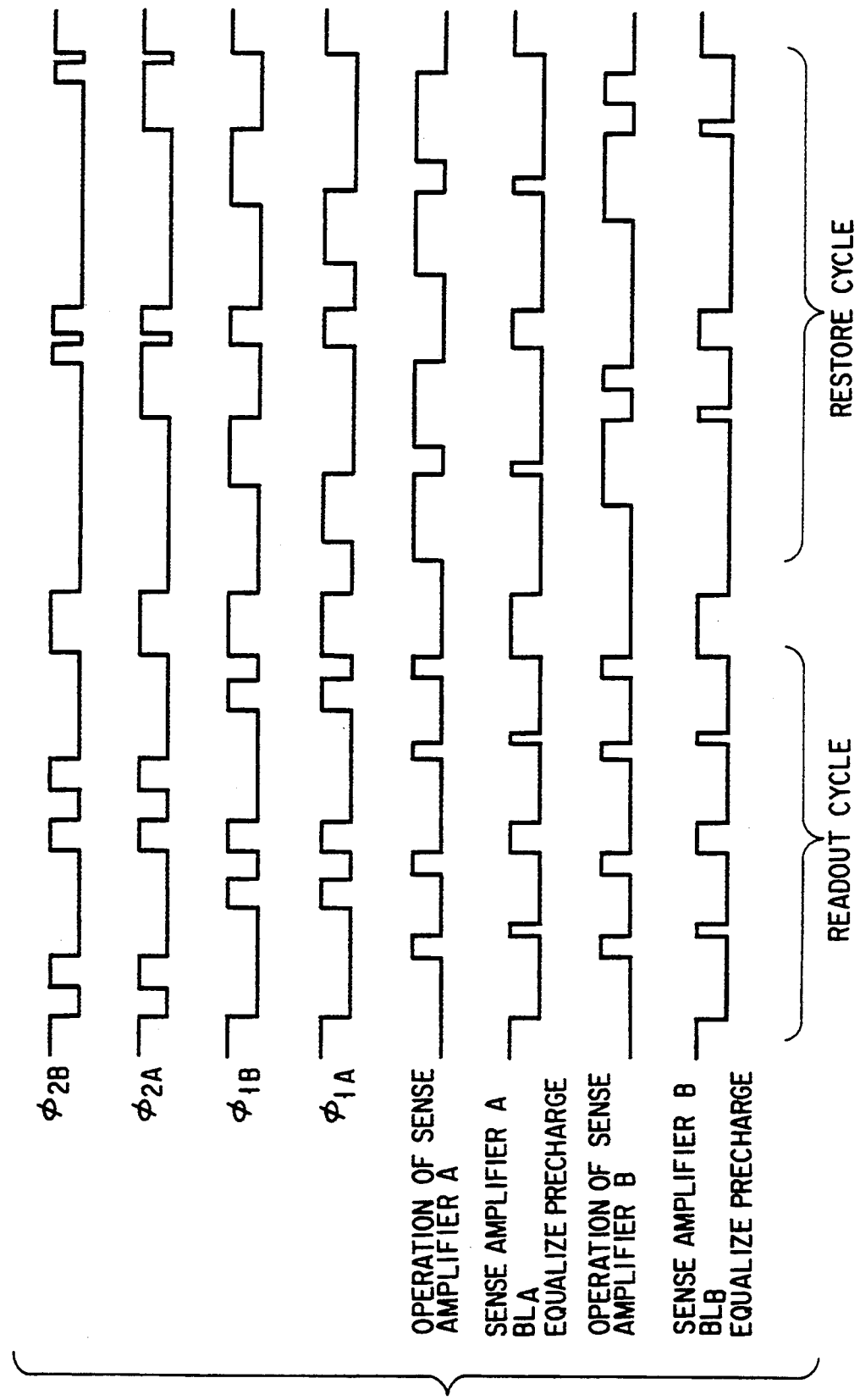
F I G. 10

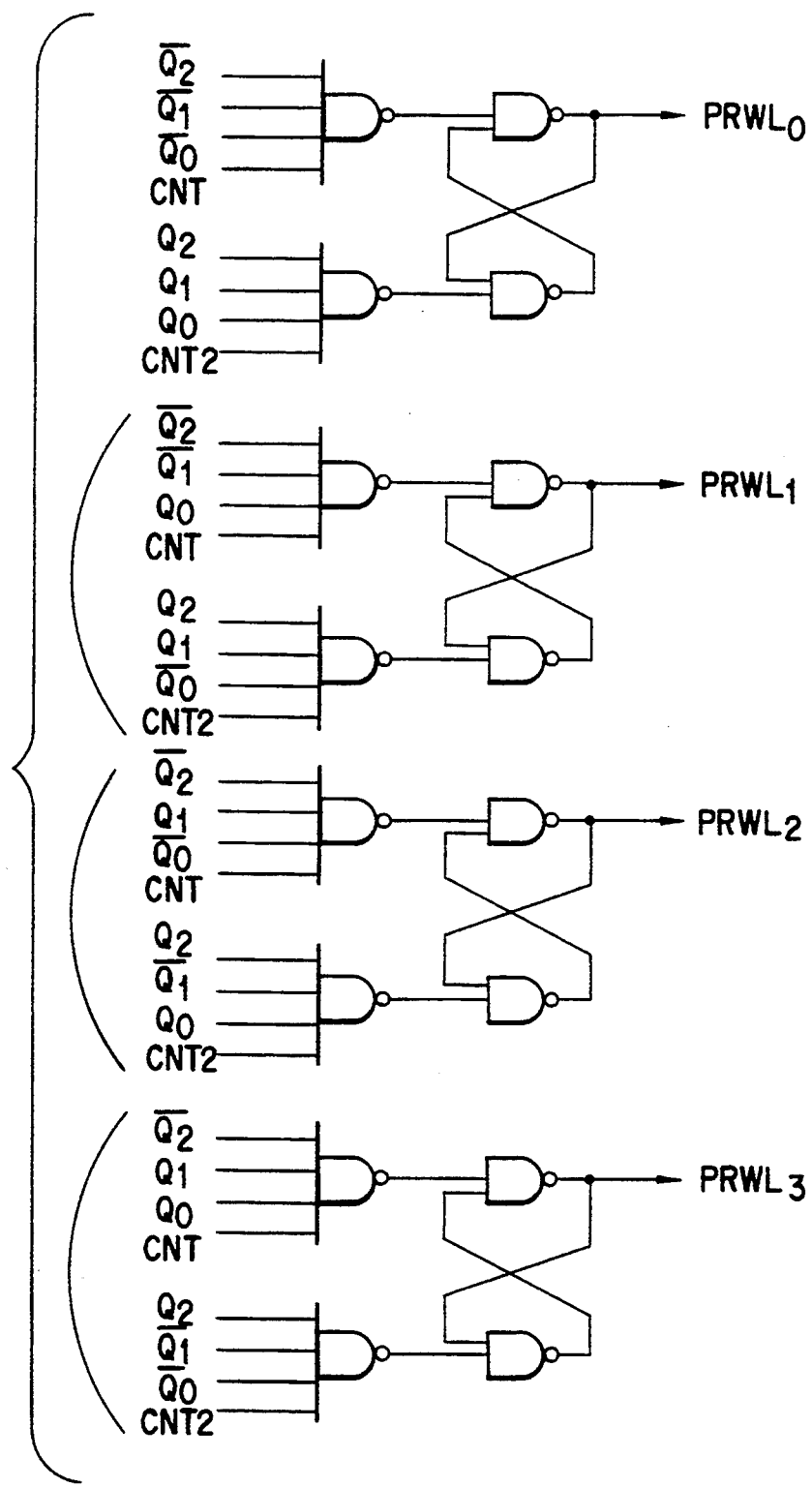
F I G. 20

SEMICONDUCTOR MEMORY DEVICE FOR SUPPRESSING NOISES OCCURRING ON BIT AND WORD LINES

BACKGROUND OF THE INVENTION

1. Field of the Invention

This invention relates to a semiconductor memory device, particularly, a dynamic semiconductor memory device (DRAM).

2. Description of the Related Art

Conventionally, an open bit line configuration having a bit line pair constructed by a bit line and a complementary bit line which are connected to both ends of one sense amplifier is provided as a bit line configuration which permits the area of the memory cell area to be reduced. However, the size of the memory cell itself becomes smaller as the capacity of the semiconductor memory device is made gradually larger, and a space between the bit line pair becomes smaller, thereby making it difficult to dispose the sense amplifier in the space between the bit lines.

As a method for solving the above problem, a method for commonly using a plurality of sense amplifiers for bit lines of a number larger than the number of the sense amplifiers and sequentially reading out or writing data of the bit lines after amplifying the data by the sense amplifiers is proposed (1991, IEEE ISSCC DIGEST OF TECHNICAL PAPERS vol. 34, p. 106 TAM6.2). With this method, the sense amplifier can be disposed without increasing the area of the memory cell area.

However, this type of method has the following problem. Since the bit line which is not connected to the sense amplifier is set into the electrically floating state, noises will be generated in a non-connected bit line adjacent to a selected bit line by the capacitive coupling between the bit lines when data amplified by the sense amplifier is written into the selected bit line, and as a result, the effective signal amount is reduced.

The above problem is explained with reference to FIG. 1.

FIG. 1 is a diagram showing the circuit construction of this type of DRAM, a plurality of bit lines BL are connected to a current mirror type sense amplifier via transfer gates. A reference line of the sense amplifier is connected to adjacent reference cell arrays of a read out cell array, and constructs a quasi-folded bit line scheme in which the reference line is shared by a plurality of sense amplifiers. A Write-in circuit is used to write-in to the cells. The data are sequentially written-in to m bit lines $BL_{1N}$, $BL_{2N}$, ..., $BL_{mN}$ from the write-in circuit via the transfer gates.

In this case, when the transfer gates are selected in an order from $\phi_1$ to $\phi_m$, a bit line other than the bit line ($BL_{mN}$) which is lastly selected for the n-th sense amplifier is influenced by a variation in the potential amplitude of an adjacent bit line. Particularly, $BL_{1N}$ is influenced by a variation in the potential amplitude of an adjacent bit line ($BL_{2N}$) when $\phi_2$ is selected and a variation in the potential amplitude of another adjacent bit line ($BL_{m(N-1)}$) when $\phi_m$ is selected. That is, in case of selecting transfer gate in order of $\phi_1$ to $\phi_m$, since an order of connection of bit lines are periodic for each sense amplifier, the bit line $BL_{2N}$ which is disposed in the end position and first selected is influenced twice by variations in the potential amplitudes of the adjacent bit lines and thus the noise in the first bit line becomes large.

Further, there is known a method for operating a pseudo word line (that is, dummy word line) at the same time as the operation of the word line in order to cancel noises caused by the capacitive coupling between the word line and the bit line. There are two methods for disposing dummy word lines in, for example, the open bit line configuration described above in which a pair of bit lines are separately disposed on both sides of the sense amplifier.

The first method is an in-phase type dummy word line configuration in which a dummy word line is disposed on the opposite side of a word line (i.e., reference bit line (/BL) side) to be selected with respect to the sense amplifier and the word line and the dummy word line are driven in the same phase. The second method is an inverted phase type dummy word line configuration in which a dummy word line and a word line to be selected are disposed on the same side (i.e., bit line (BL) side) with respect to the sense amplifier and the word line and the dummy word line are driven in the inverted phase.

One example of the construction of the in-phase type dummy word line configuration is shown in FIG. 2 and the operation timing thereof is shown in FIG. 3.

In the word line configuration shown in FIG. 2, a single dummy word for selecting a word line to memory cells allocated to the both side of the sense amplifier are disposed on both sides of the sense amplifier, and when the potential of the word line $WL_{nL}$ is raised to access a memory cell, the potential of the dummy word line $DWL_R$ disposed on the opposite side of the memory cell to be accessed is raised in synchronism with the rise in the word line potential. The same potential as the precharge potential of the bit line BL must be previously written into the dummy cell. For this reason, the dummy cell has a structure which is different from that of a normal one-transistor/one-capacitor memory cell and obtained as a two-transistor/one-capacitor structure having a precharge transistor additionally connected thereto.

However, in a dynamic semiconductor memory device (which is hereinafter referred to as a "NAND type DRAM") in which a memory cell block having a structure obtained by serially connecting DRAM cells each constructed by a one-transistor/one-capacitor structure is used as a basic unit of access, the potentials of the word lines of a number corresponding to the number of the series-connected memory cells are sequentially raised or lowered. Therefore, in the NAND type DRAM, the noise on the word line giving influence to the bit line cannot be canceled by use of the conventional method in which one dummy word line is set to correspond to one word line.

Since a given bit of the series-connected DRAM cells is accessed for readout or write-in in the NAND type DRAM, all of the cell transfer gates (word lines) of the series-connected memory cells are sequentially driven. More specifically, in a case where four DRAMs are serially connected, a sequence of operations of sequentially activating the potentials of all of the four word lines WL for data readout and sequentially lowering the word lines WL for data write-in as shown in FIG. 4 are effected.

In a case where only the access to data of a cell which lies nearer to the bit line contact is necessary, the operation of driving the word line for cells which lie farther from the bit line contact is not necessary. However, in a method in which all of the word lines are sequentially driven, the access time and power consumption are increased by the operation of driving the unnecessary word line.

As described above, in a method in which a plurality of bit lines are sequentially connected to the sense amplifier to amplify a signal, noises caused by the capacitive coupling or the like will occur on adjacent bit lines and larger noises occur on a bit line which is first selected at the time of write-in operation for the memory cell.

In the NAND type DRAM, since the potentials of the word lines of a number equal to the number of the series-connected memory cells are sequentially raised or lowered, the noise on the word line giving influence to the bit line cannot be canceled by use of the conventional method in which one dummy word line is set to correspond to one word line.

Further, in a case where all of the word lines of a number equal to the number of the series-connected memory cells are driven in each access in the NAND type DRAM, the power consumption and the average access time are increased.

SUMMARY OF THE INVENTION

An object of this invention is to provide a semiconductor memory device in which noises occurring on electrically floating bit lines can be suppressed, thereby enhancing the reliability thereof.

Another object of this invention is to provide a semiconductor memory device in which noises caused by the capacitive coupling between the word line and the bit line in a NAND type DRAM cell and with which a dummy word line configuration using no memory cell of special structure as a dummy cell can be realized.

Still another object of this invention is to provide a semiconductor memory device in which an increase in the power consumption and access time due to the useless operation of word lines in a NAND type DRAM can be prevented.

This invention is made to have the following constructions in order to solve the above problems.

A semiconductor memory device of the invention is characterized by comprising: a plurality of memory cells; a plurality of bit lines respectively connected to the memory cells; a plurality of sense amplifiers, connected to corresponding bit line groups including predetermined number of bit lines of the plurality of bit lines, for reading out data of memory cells connected to bit lines of the bit line groups, the bit line groups including at least adjacent first and second bit line groups; at least first and second transistors allocated between the bit lines and the sense amplifiers thereto and having gates, for selectively connecting the bit lines and the sense amplifiers; and a plurality of control signal lines commonly connected to the first transistors connected to the first bit line groups and the second transistors connected to the second bit line groups, wherein the first transistors connected to the first bit line groups are regularly arranged from given direction, and second transistor connected to the second bit line groups adjacent to the first bit line groups are regularly arranged from opposite direction thereof. The memory cells is characterized by including memory cell units including a plurality of memory cells connected in series, and the memory cell units are connected to the corresponding bit lines. Adjacent two of the bit lines are respectively connected to two of the sense amplifiers which are operated at different timings. The first and the second transistors are symmetrically arranged for adjacent bit line groups.

The invention is characterized by further comprising write-in means for writing data for the bit line at least twice. The write-in means is characterized by including means for omitting the second and succeeding writing operations for the bit line into which data is last written in the first cycle.

A semiconductor memory device of the invention characterized by comprising: a plurality of memory cells; a plurality of bit line groups including a predetermined number of bit lines connected to the memory cells, the bit line groups including at least adjacent first and second bit line groups; first and second sense amplifiers each connected to at least tow bit lines of the bit line groups, adjacent bit lines connected to different sense amplifiers, respectively; at least first and second transistors arranged the plurality of bit lines and having gates, for selectively connecting the bit lines and the sense amplifiers; and a plurality of control signal lines commonly connected to the first transistors connected to the first bit line groups and the second transistors connected to the second bit line groups, wherein the first transistors connected to the first bit line groups are regularly arranged from given direction, and second transistor connected to the second bit line groups adjacent to the first bit line groups are regularly arranged from opposite direction thereof. The memory cells is characterized by including memory cell units including a plurality of memory cells connected in series, and the memory cell units are connected to the corresponding bit lines. The first and the second transistors are symmetrically arranged for adjacent bit line groups.

A semiconductor memory device of the invention characterized by comprising: a plurality of memory cells; a plurality of bit line groups each having a predetermined of bit lines connected to the memory cells, the bit line groups including at least adjacent first and second bit line groups; a plurality of sense amplifiers connected to the corresponding bit line groups including first end bit lines and second end bit lines, for reading out data of memory cells connected to the bit lines of the bit line groups; and means for simultaneously effecting write-in operation of the first end bit line of the first bit line groups and the second end bit line of the second bit line groups adjacent thereto and effecting write-in operation of bit line except the first end bit line and the second end bit line with at least one adjacent bit line for which the write-in operation is already effected.

A semiconductor memory device of the invention is characterized by comprising: a plurality of memory units including a plurality of memory cells connected in series; a plurality of word lines connected to the plurality of memory cell units; a sense amplifier connected to the bit lines, for reading out data of the memory cells of the memory cell units connected to the corresponding bit lines; a plurality of dummy cell units connected the bit lines and including a plurality of dummy cells connected in series, each the dummy cell having a gate; a plurality of dummy word lines connected the gates of the plurality of dummy memory cells; means for activating all the dummy word lines in waiting state; and means for sequentially deactivating the dummy word lines far from bit line contacts for sequentially activating the word lines connected to the memory cell units near from the bit line contact in a reading operation. A semiconductor memory device of the invention is characterized by further comprising means for sequentially activating the dummy word lines near from bit line contacts for sequentially deactivating the word lines connected to the memory cell units far from the bit line contact in a rewrite operation of the memory cell, and reference bit lines arranged opposite side of the bit lines for the sense amplifiers, wherein the dummy cell units is connected the reference bit lines. Selecting operation of at least one of the word lines and dummy word lines are controlled to equalize the number of at least one of all the memory cells and all the dummy memory cells connected the bit lines by the selecting operation with the number of the dummy memory cells connected to the reference bit lines.

A semiconductor memory device of the invention characterized by comprising: a plurality of memory cell units including a plurality of memory cells connected in series, the memory cells having gates; a plurality of bit lines connected to the plurality of memory cell units; a plurality of word lines connected to the gates of the plurality of the memory cells; a sense amplifier connected to the bit lines, for reading out data of the memory cells of the memory cell units connected to the corresponding bit lines; means for sequentially activating the word lines connected to the memory cell units from the word lines connected to memory cells near bit line contacts to the word lines connected to selected memory cells in one of read-out and write-in operation of the data of the selected memory cells of the memory cell units; means for preventing from activating the word lines connected to memory cells further than the selected memory cells from the bit line contacts; and means for sequentially deactivating the word line connected to the selected memory cells to the word lines connected to memory cells near the bit line contacts.

In a semiconductor memory device according to the invention, the transistor gates between the bit lines and the sense amplifier are connected to control signal lines of the sense amplifier in an order opposite to that in the adjacent sense amplifier so that the first bit line will be influenced only once like the other bit lines while the only the first selected bit line is influenced twice by the potential amplitudes of the adjacent bit lines in the conventional case. With the structure of the semiconductor memory device according to the second aspect of this invention, the number of influences on the first bit line by the potential amplitudes of the adjacent bit lines can be suppressed to one and the number of influences on each of the bit lines by the potential amplitudes of the adjacent bit lines thereof can be suppressed to one or less.

In a semiconductor memory device according to another aspect of this invention, the adjacent bit lines are connected to the sense amplifiers operated at different timings and the influences by the potential amplitudes can be mutually compensated for by the operations of the sense amplifiers. In this case, an effective reduction in the signal charge stored in the cell can be prevented by effecting the potential amplification for at least one bit line at least twice when data is written into the memory cell and compensating for noises caused by the potential amplitudes of the adjacent bit lines by a plurality of amplifications by the sense amplifiers. In this case, since the sense amplifier operation is effected to compensate for a signal which is reduced by the noise and the potential amplitude of the bit line is extremely small, the amplification operation itself will not affect the adjacent bit lines.

As described above, according to the semiconductor memory device of the invention, the noise caused in the bit line set in the electrically floating state by the potential amplitude of the adjacent bit lines can be significantly reduced, thereby making it possible to increase the effective signal amount stored in the memory cell in comparison with a conventional case.

In a semiconductor memory device according to still another aspect of this invention, capacitive coupling noises of the word line and bit line can be canceled like the case of the conventional inverted phase complementary dummy word line configuration. Further, since the number of memory cells connected to the bit line is kept at the same value on both sides of the sense amplifier (that is, in each of the paired bit lines), the capacitive balance of the paired bit lines in the operation of the sense amplifier can be kept and a stable circuit operation can be attained. As described above, capacitive coupling noises of the word line and bit line of the NAND type DRAM can be canceled without using a dummy cell having a special structure and the number of cells connected to the bit line is kept at the same value so as to keep the capacitive balance of the bit lines constant and attain the stable operation of the circuit, and in addition, since the number of selected word lines in the NAND type DRAM can be freely controlled, an increase in the average cycle time and the power consumption caused by the operation of driving the unnecessary word lines can be suppressed to a minimum.

In a semiconductor memory device according to still another aspect of this invention, since the operation of driving the unnecessary word lines can be omitted, the average access time and the average current consumption can be significantly reduced.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 10 is an operation timing diagram in the third embodiment;

FIG. 20 is a diagram showing an example of a circuit for generating a word line control signal according to an output of a counter.

DETAILED DESCRIPTION OF THE PREFERRED EMBODIMENTS

There will now be described an embodiment of this invention with reference to the accompanying drawings.

Figure 6:
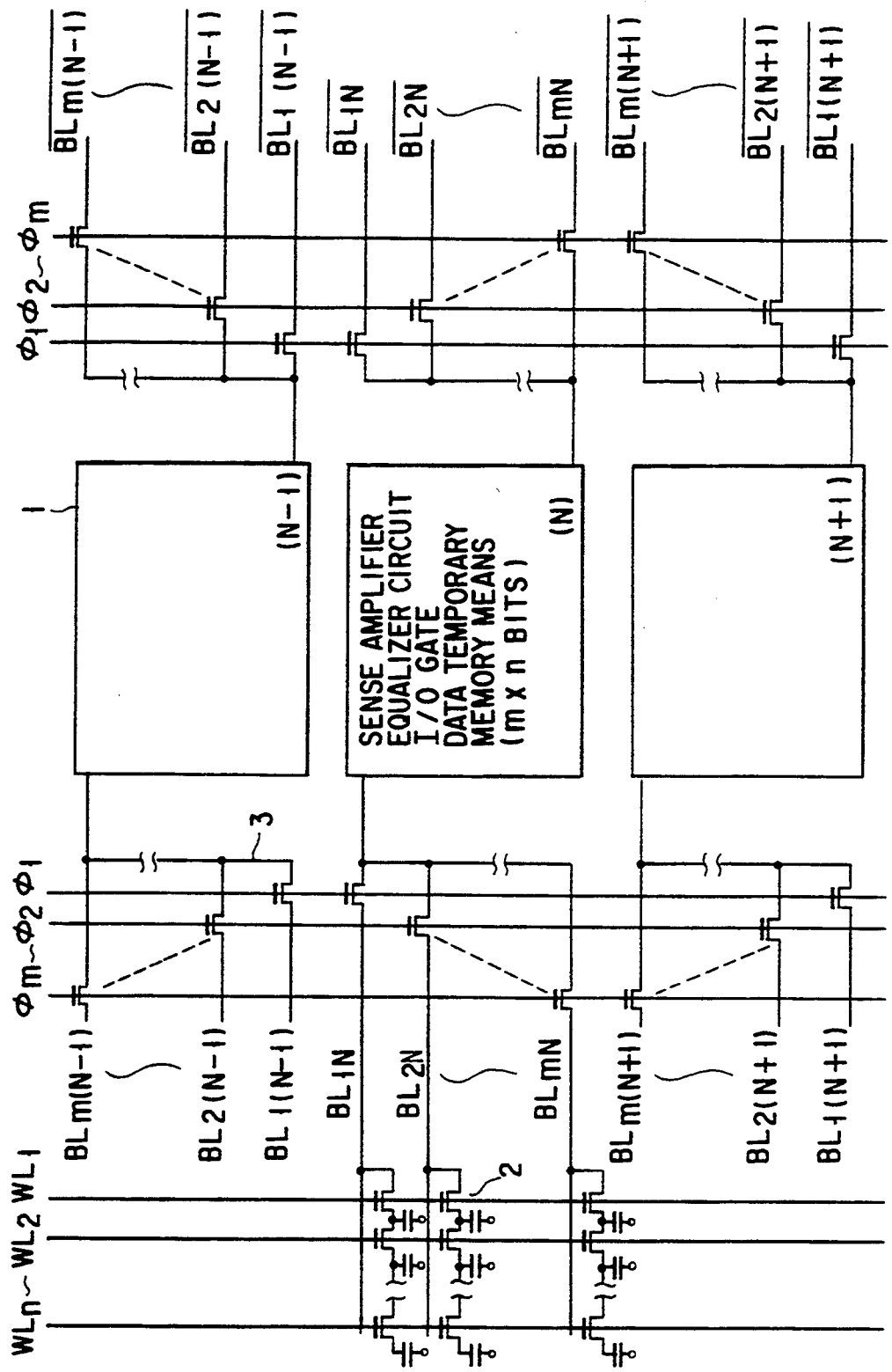
FIG. 6 is a circuit construction diagram showing a DRAM according to a first embodiment of this invention.

FIG. 6 is a circuit construction diagram showing a DRAM according to a first embodiment of this invention. In the following drawings, transistors and wirings are expressed by symbols, but at least the actual allocation of the bit lines follows the allocation indicated in the drawing.

In FIG. 6, the DRAM of this invention includes circuits 1 (which are hereinafter referred to as sense amplifiers) each having a sense amplifier, equalizer, data temporary memory section and the like, memory cell units 2 each constructed by series-connecting a plurality of DRAM cells, transfer gates 3 for selecting memory cell units, bit lines BL (which are hereinafter simply denoted by BL when it is not necessary to separately specify the individual bit lines), word lines WL (which are hereinafter simply denoted by WL when it is not necessary to separately specify the individual word lines), and control signal lines $\phi_x$ (x=1, 2, ..., m) (which are hereinafter simply denoted by $\phi$ when it is not necessary to separately specify the individual control signal lines) for the transfer gates 3.

In the first embodiment, the order of selection of the bit lines BL is changed for each sense amplifier. More specifically, the bit lines BL are connected to the Nth sense amplifier, for example, in an order from the bit line $BL_{mN}$ to the bit line $BL_{1N}$, and the bit lines are connected to the (N−1)th or (N+1)th sense amplifier in an order opposite to that of the Nth sense amplifier, that is, in an order from the bit line $BL_{m(N−1)}$ to the bit line $BL_{1(N−1)}$ or from the bit line $BL_{m(N+1)}$ to the bit line $BL_{1(N+1)}$. The gate of transistor 3 connected to an arbitrary bit line in a bit line group connected to the sense amplifier is controlled by a common signal line $\phi_x$ connected to the gate of the transistor which is connected to an arbitrary bit line in a bit line group connected to another sense amplifier.

In the first embodiment, the NAND type cell which is constructed by series-connected DRAM cells is used, the number of series-connected cells is set to n, and the number of bit lines connected to one sense amplifier. The numbers n and m can be set to desired numbers. In the first embodiment, data temporary memory means (not shown) of n×m bits is disposed near the sense amplifier, and data read out from the memory cell is stored in the temporary memory (readout cycle) and then rewritten into the memory cell (restore cycle).

Figure 1:
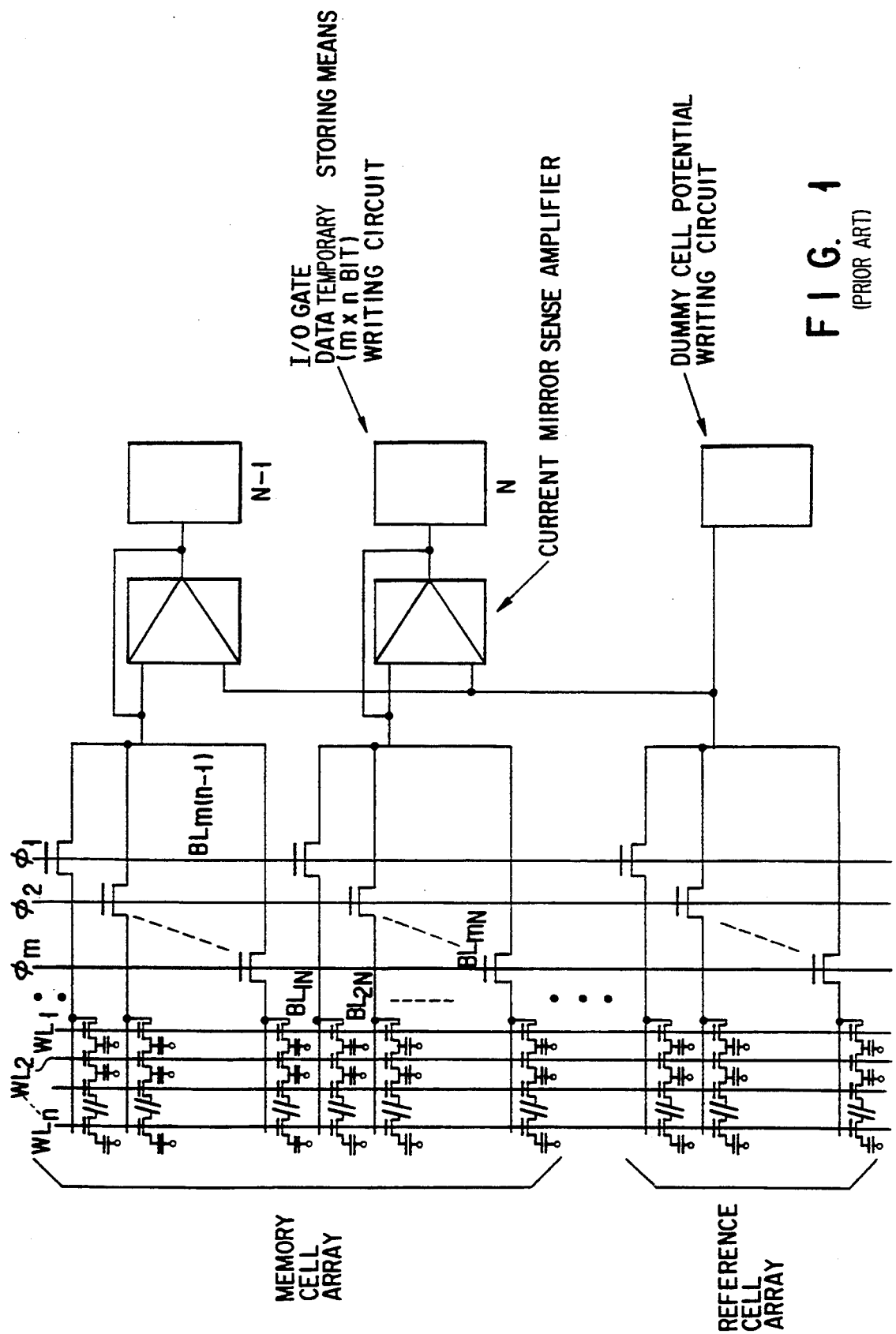
FIG. 1 is a circuit construction diagram showing a conventional DRAM.
Figure 2:
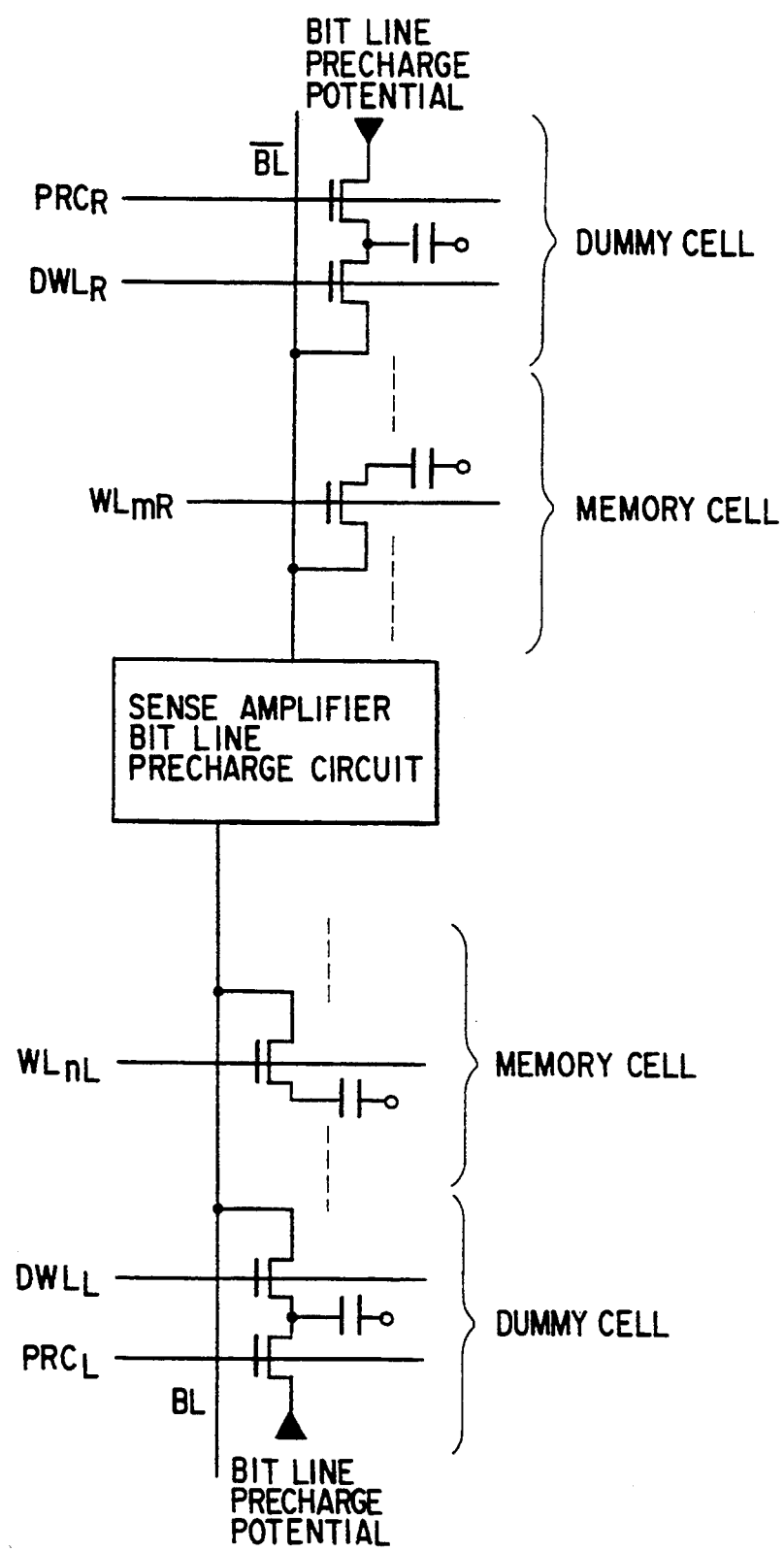
FIG. 2 is a diagram showing one example of the construction of a conventional in-phase dummy word line configuration.
Figure 3:
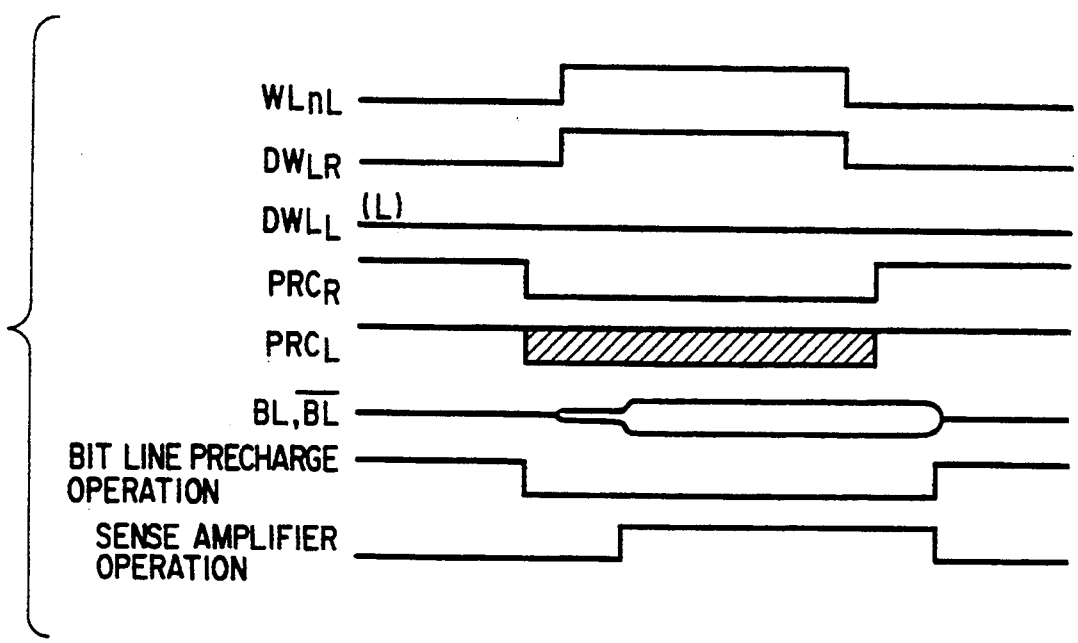
FIG. 3 is a diagram showing the operation timing of an in-phase type dummy word line configuration.
Figure 4:
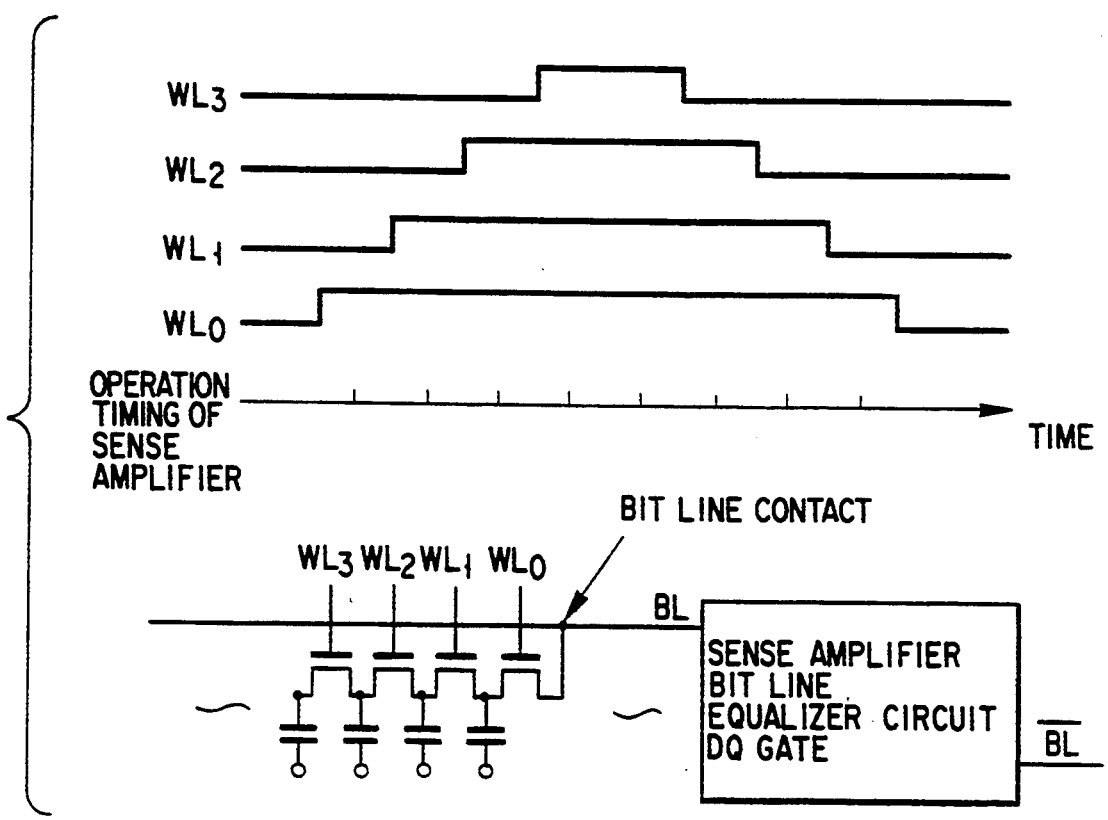
FIG. 4 is a diagram showing the timing of word line selection in a conventional NAND type RAM.
Figure 5:
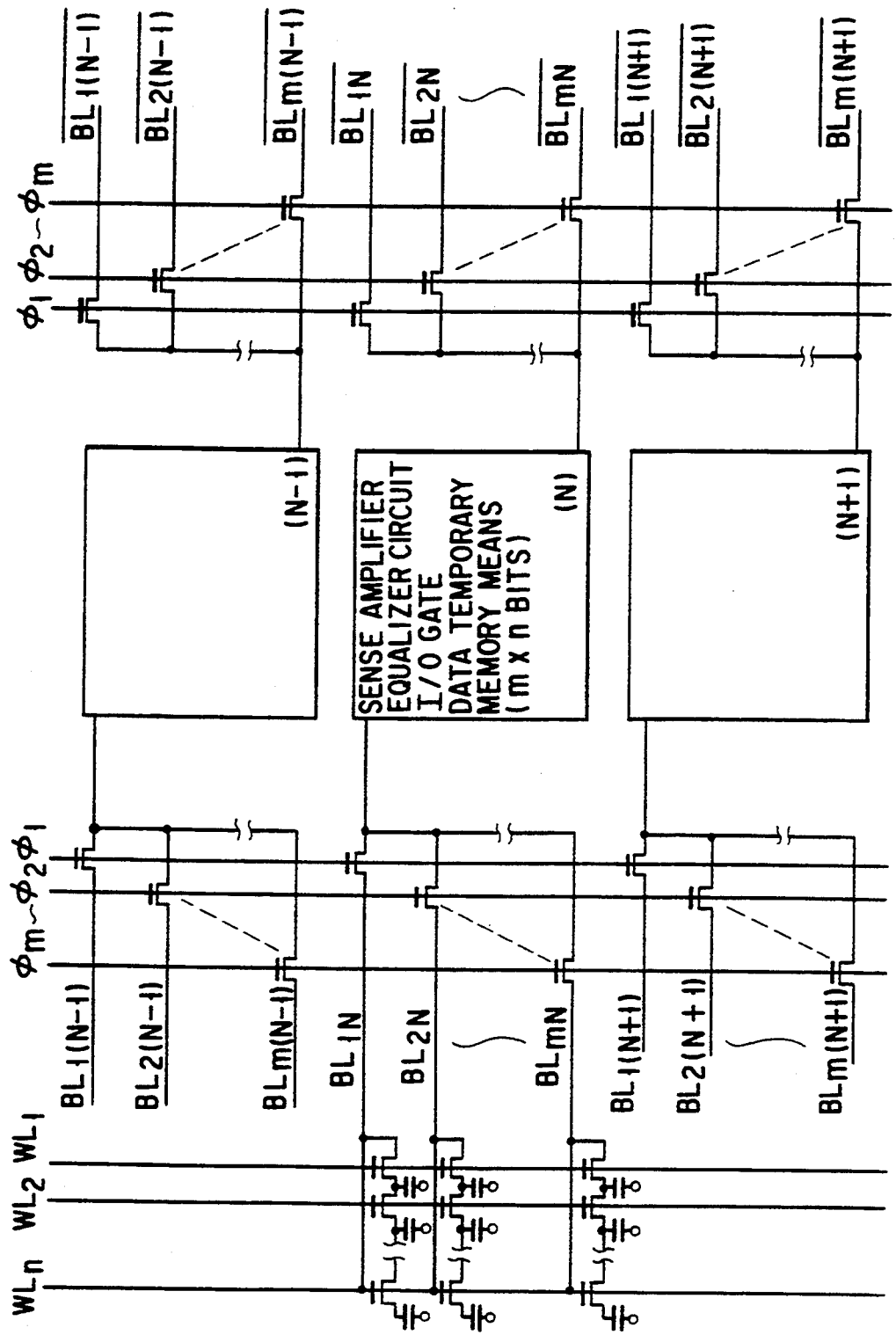
FIG. 5 is a circuit construction diagram showing a conventional DRAM.
Figure 7:
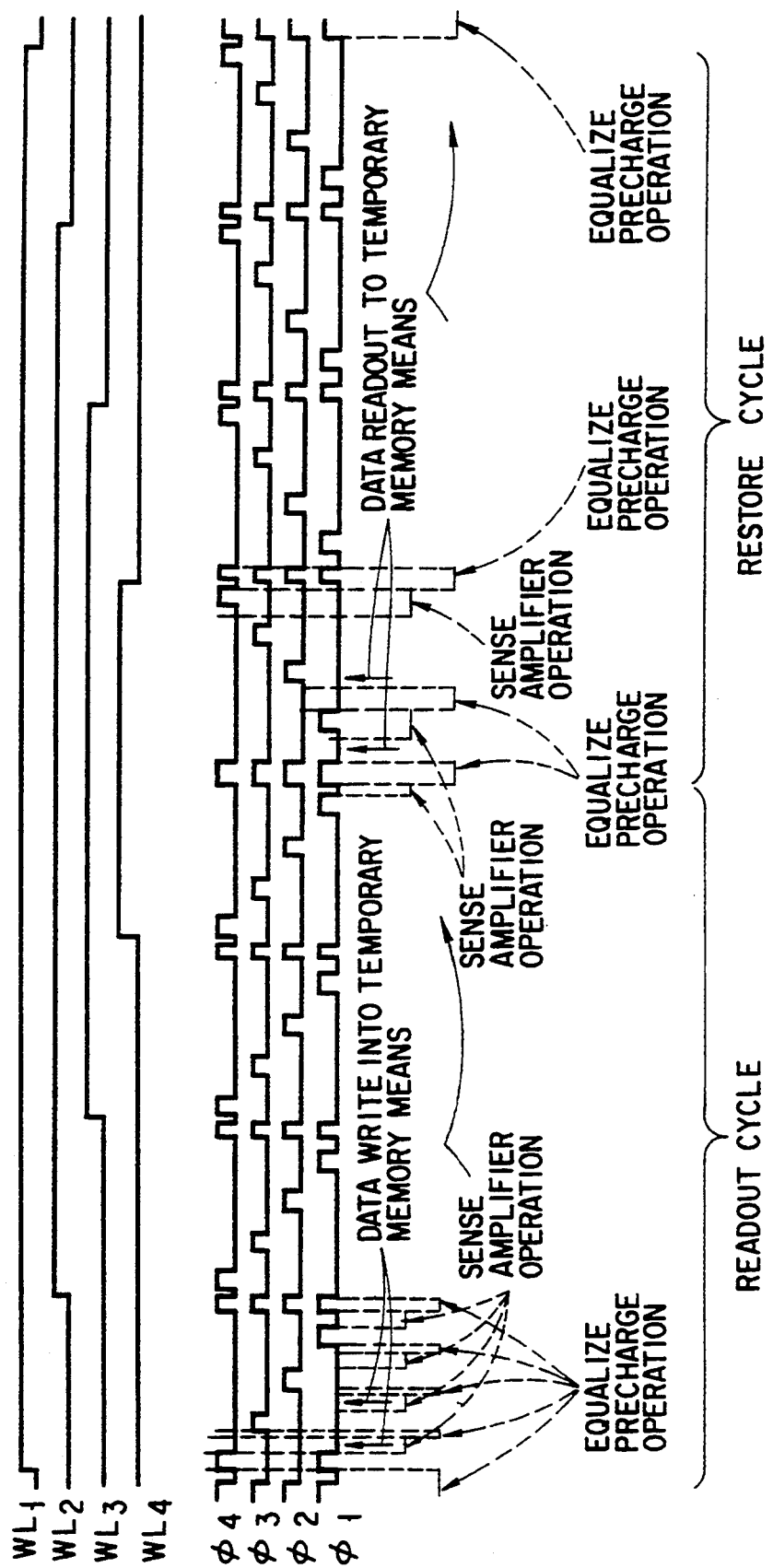
FIG. 7 is a diagram showing the operation timings of a bit line selection transistor and a sense amplifier in the first embodiment.

An comparing example for explaining the first embodiment is shown in FIG. 5. In this figure and FIG. 6, a flip-flop type sense amplifier is used and open bit line method is employed. An affect of potential amplitude of bit line for writing into the memory cell to adjacent floating bit lines is same as in the case of FIGS. 1 and 2. In FIG. 1, the orders of the bit lines to be connected to the sense amplifiers are periodically changed for each sense amplifier. FIG. 7 is a diagram showing the operation timings of bit line selection transistors and sense amplifiers having the construction of FIG. 6 or 5 and n=m=4.

With the construction of FIG. 6, when the bit line $BL_{1N}$ which belongs to the Nth sense amplifier and will be first selected is selected, the bit line $BL_{1(N−1)}$ of the adjacent (N−1)th sense amplifier which is selected at the same time as the above bit line lies in the adjacent position so that the bit line $BL_{1N}$ will not be influenced by the bit line $BL_{1(N−1)}$. Therefore, only the bit line $BL_{2N}$ gives noises to the first selected bit line $BL_{1N}$ by a variation in the potential amplitude of the adjacent bit lines. On the other hand, with the conventional construction shown in FIG. 5, two bit lines, that is, the bit line $BL_{2N}$ in case of selecting $\phi_2$ and the bit line $BL_{m(N−1)}$ in case of selecting $\phi_m$ belonging to the adjacent sense amplifier give noises to the bit line $BL_{1N}$. Therefore, in the first embodiment, the noise given from the adjacent bit lines to the bit line $BL_{1N}$ which is first connected to the sense amplifier can be reduced to half.

Figure 8:
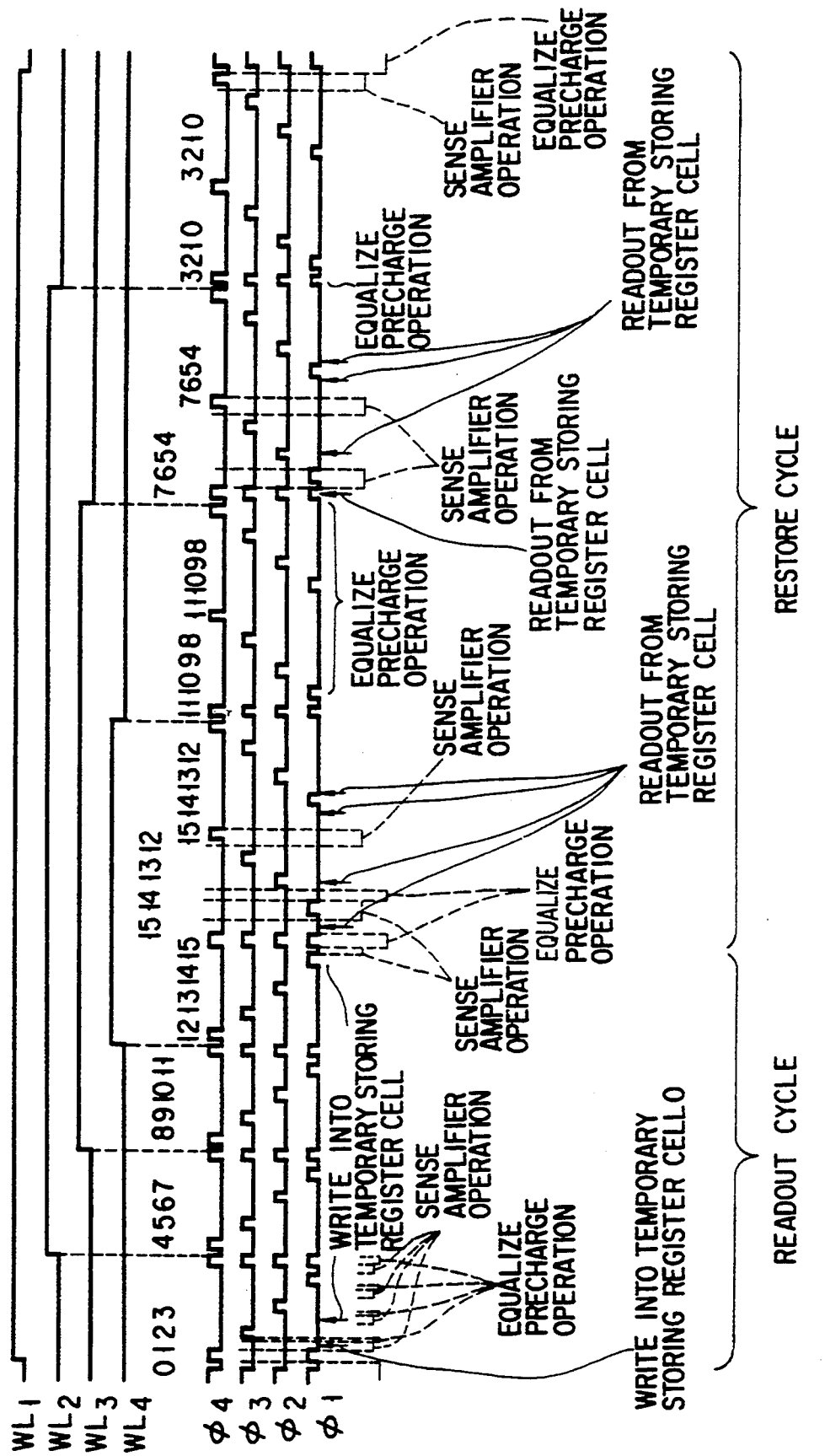
FIG. 8 is a diagram showing the operation timings of a bit line selection transistor and a sense amplifier in a second embodiment.

Next, a second embodiment of this invention is explained. In the second embodiment, the constructions of the sense amplifier and the bit lines are the same as those shown in FIG. 6 or 5. FIG. 8 is a diagram showing the operation timings of this embodiment and n=m=4 as in the case of FIG. 7.

In the second embodiment, since the process up to the end of the first write-in operation is the same as that of the conventional technology, the potential written into each of the bit lines at this stage is influenced by a variation in the potential amplitude of the adjacent bit lines and contains noises. However, when the write-in operation is repeatedly effected for the bit line, the bit line can be set to a desired potential (that is, a power source voltage Vcc or 0 V according to the contents of data). Where, temporary storing means of data id constructed by a plurality of DRAM cells and these cells are common for a plurality of bit lines sharing a sense amplifier.

In the above operation, since the potential amplitude of the bit line at the time of second write-in operation is used only to compensate for a variation in the potential caused by the above noise, it is extremely small in comparison with a large potential amplitude from the precharge potential to the power source voltage Vcc or 0 V caused at the first write-in operation to the bit line, and therefore, the influence thereof on the adjacent bit line is small. As a result, the noise caused by the coupling capacitance between the bit lines or the like at the time of second or succeeding write-in operations.

In the second embodiment, the write-in operations are effected twice for each of the bit lines, but the write-in operation may be effected only once for the last accessed bit line and the number of rewrite-in operations is not limited to two.

Figure 9:
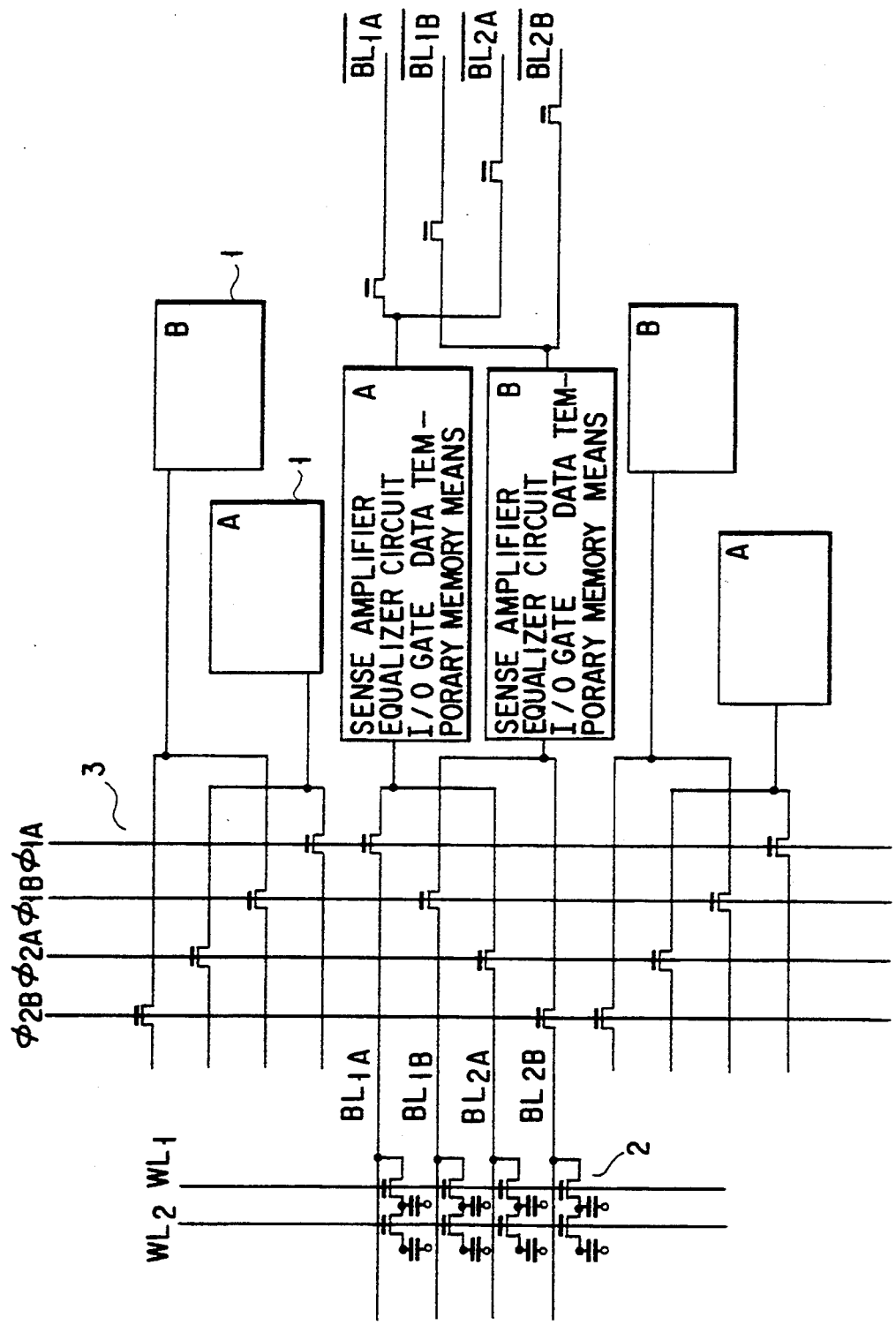
FIG. 9 is a circuit construction diagram showing a DRAM according to a third embodiment.

FIG. 9 is a circuit diagram of a third embodiment and FIG. 10 is a diagram showing the operation timing of this embodiment. In the third embodiment, a NAND type cell constructed by two series-connected DRAM cells is used, two pairs of bit lines are commonly used by one sense amplifier, and two sense amplifiers are combined to construct one unit. However, the number of series-connected cells in the NAND type cell and the number of bit line pairs commonly used by one sense amplifier are not limited to the above values.

The two sense amplifiers A and B are operated at different timings and the bit lines connected to the sense amplifiers are alternately arranged. The four pairs of bit lines are connected to the sense amplifiers in an order from the end bit line towards the other end bit line and the order is reversed for selection of the bit lines in the same manner as in the first embodiment. The principle of the operation in the write-in cycle of the third embodiment is explained with reference to FIGS. 9 and 10. Data read out from the data temporary memory means is amplified by the sense amplifier A, the signal $c1A$ is set to the "H" level to render the bit line selection transistor conductive, and data is written into the bit line $BL_{1A}$. Then, the bit line $BL_{1B}$ connected to the second sense amplifier B is selected and data amplified by the sense amplifier B is written into the selected bit line. At this time, the sense amplifier A is kept operated and the noise given to the bit line $BL_{1A}$ which is adjacent to the bit line $BL_{1B}$ by the potential amplitude of the bit line $BL_{1B}$ is immediately compensated for.

After this, the signal $\phi_{1A}$ is set to the "L" level while the sense amplifier B is kept in the operative state, the bit line selection transistor is made conductive to equalize the sense amplifier A, and the signal $\phi_{2A}$ is set to the "H" level to permit data read out from the data temporary memory means to be transmitted to the bit line $BL_{2A}$. The potential of the bit line $BL_{1B}$ in which data is already written by the potential amplitude of the bit line $BL_{2A}$ tends to vary by capacitive coupling between $BL_{1A}$ and $BL_{1B}$, but the variation is immediately canceled since the sense amplifier B is kept operated.

Likewise, the potential of the bit line $BL_{2B}$ is also written while the potential of the bit line $BL_{2A}$ is fixed by the sense amplifier A, but at this time, since the adjacent bit lines contain a bit line $BL_{2B}$ of the adjacent unit whose potential is simultaneously amplified and the bit line $BL_{2A}$ whose potential is compensated for by the sense amplifier A, the influence of the noise on the signal potential caused by the capacitive coupling between the bit lines can be completely compensated for simply by effecting the sense amplifier operation once for all of the bit lines.

Figure 11:
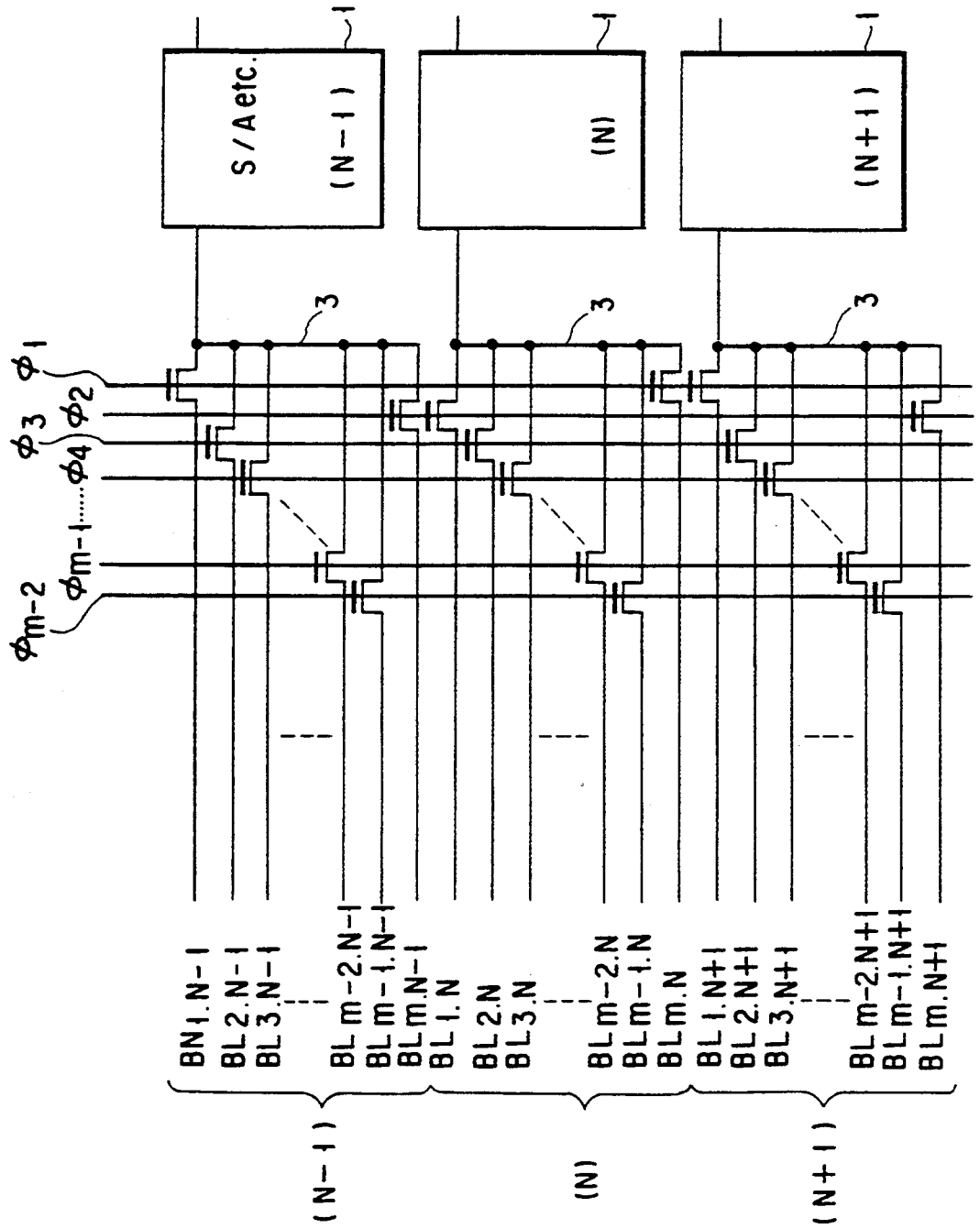
FIG. 11 is a circuit construction diagram showing a DRAM according to a fourth embodiment.

FIG. 11 is a circuit construction diagram showing a DRAM according to a fourth embodiment of this invention. In the first embodiment, the order of connection of the bit lines BL is reversed in the adjacent sense amplifiers, but in the fourth embodiment, the following three rules are determined and the write-in operation is effected based on the following rules.

(1) The write-in operation is effected for the bit line lying in the end position of the bit line group connected to the sense amplifier at the same time as the write-in operation for a bit line lying in the adjacent end position of the adjacent bit line group (first rule).

(2) The write-in operation is effected for a bit line lying in a position other than the end position with at least one adjacent bit line for which the write-in operation is already effected (second rule).

(3) The write-in operation is first effected for one of the bit lines lying in the end positions (third rule).

FIG. 11 shows a case wherein m bit lines BL are commonly used by one sense amplifier 1. In FIG. 11, the numbers of the bit lines BL for each sense amplifier are set to 1, 2, 3, - - -, m from the top position and the numbers of the sense amplifiers are set to N, (N+1), - - -. The order of the write-in operations for the cells (that is, bit lines) is specifically explained as the operation of the fourth embodiment.

According to the first and third rules, $\phi_1$ is raised to effect the write-in operation for the bit line $BL_{1,N-1}$, bit line $BL_{m,N}$, bit line $BL_{1,N+1}$, - - -. Then, $\phi_2$ is raised to effect the write-in operation for the bit line $BL_{m,N-1}$, bit line $BL_{1,N}$, bit line $BL_{m,N+1}$, - - - lying in the other end positions of the respective bit line groups connected to the respective sense amplifiers by the selection of $\phi_1$ according to the first rule.

Next, the write-in operation is effected for the remaining bit lines according to the second rule. In this case, the order can be freely determined for each sense amplifier. In this example, the order of connection of the remaining bit lines (bit lines other than the bit line lying in the end position) BL to the sense amplifier is determined such that the write-in operation can be periodically effected for each sense amplifier. The order of rise in the gate control signals $\phi_m$ is set to the order of $\phi_1, \phi_2, \phi_3, \phi_4,$ - - -, and $\phi_m$.

With the above construction, when the bit line (for example, $BL_{m,N}$) lying in the end position of the first selected bit line group is selected, the first selected bit line is not influenced by the bit line of the adjacent sense amplifier since the bit line (for example, $BL_{1,N+1}$) lying in the end position among the bit line group of the adjacent sense amplifier selected at the same time as the above bit line lies in the adjacent position of the above bit line. Therefore, the bit line giving the noise caused by the potential amplitude of the bit line adjacent to the first selected bit line is limited only to the adjacent bit line in the same bit line group, and as a result, the amount of noises from the adjacent bit lines to the bit line which is first connected to the sense amplifier is reduced to half. Therefore, the same effect as that of the first embodiment can be attained.

Figure 12:
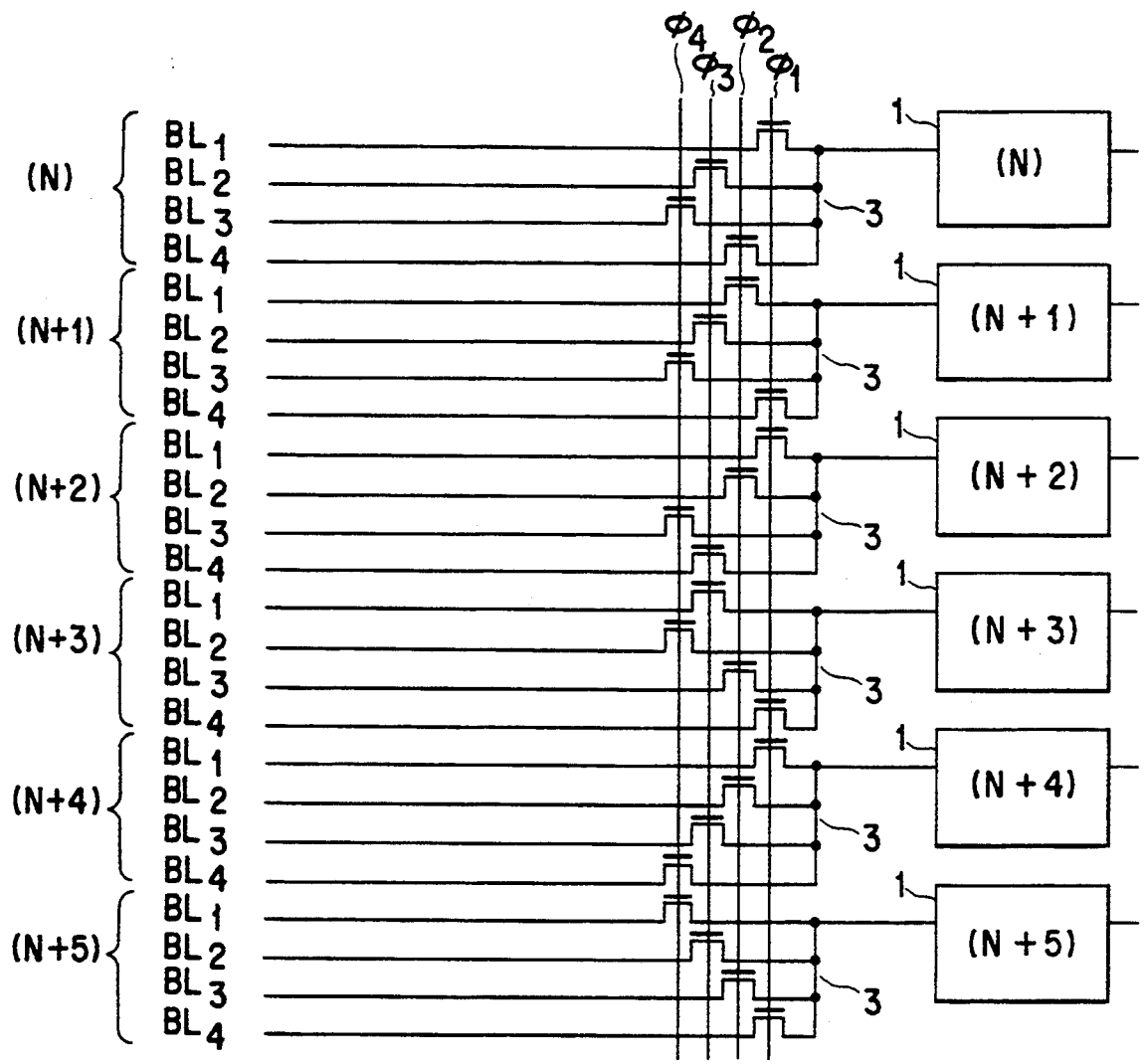
FIG. 12 is a circuit construction diagram showing a DRAM according to a fifth embodiment.

FIG. 12 is a circuit construction diagram showing a DRAM according to a fifth embodiment of this invention. In the fifth embodiment, four bit lines are connected to a plurality of sense amplifiers 1, respectively. The bit line to which the gate control signal $\phi_1$ first selected to the sense amplifier according to the above-described third rule is applied is the end bit line BL(BL$_1$ or BL$_4$) of the four bit lines. Further, the gate control signals $\phi_2$, $\phi_3$, $\phi_4$ are sequentially selected. In this case, the order of connection of the bit lines BL to the sense amplifier is not periodic for each sense amplifier but follows the above three rules.

With the above construction, since the influence by the adjacent bit line on the bit line lying in the end position among the first selected bit line group can be limited only to the influence by the bit line of the same bit line group, the same effect as that of the first embodiment can be attained.

As described above, according to the first to fifth embodiments, since the gate connection of the transistors (transfer gates) connected between the bit lines and the sense amplifiers is effected to follow the predetermined rule, the noise for the electrically floating bit line can be suppressed, thereby enhancing the reliability.

Figure 13:
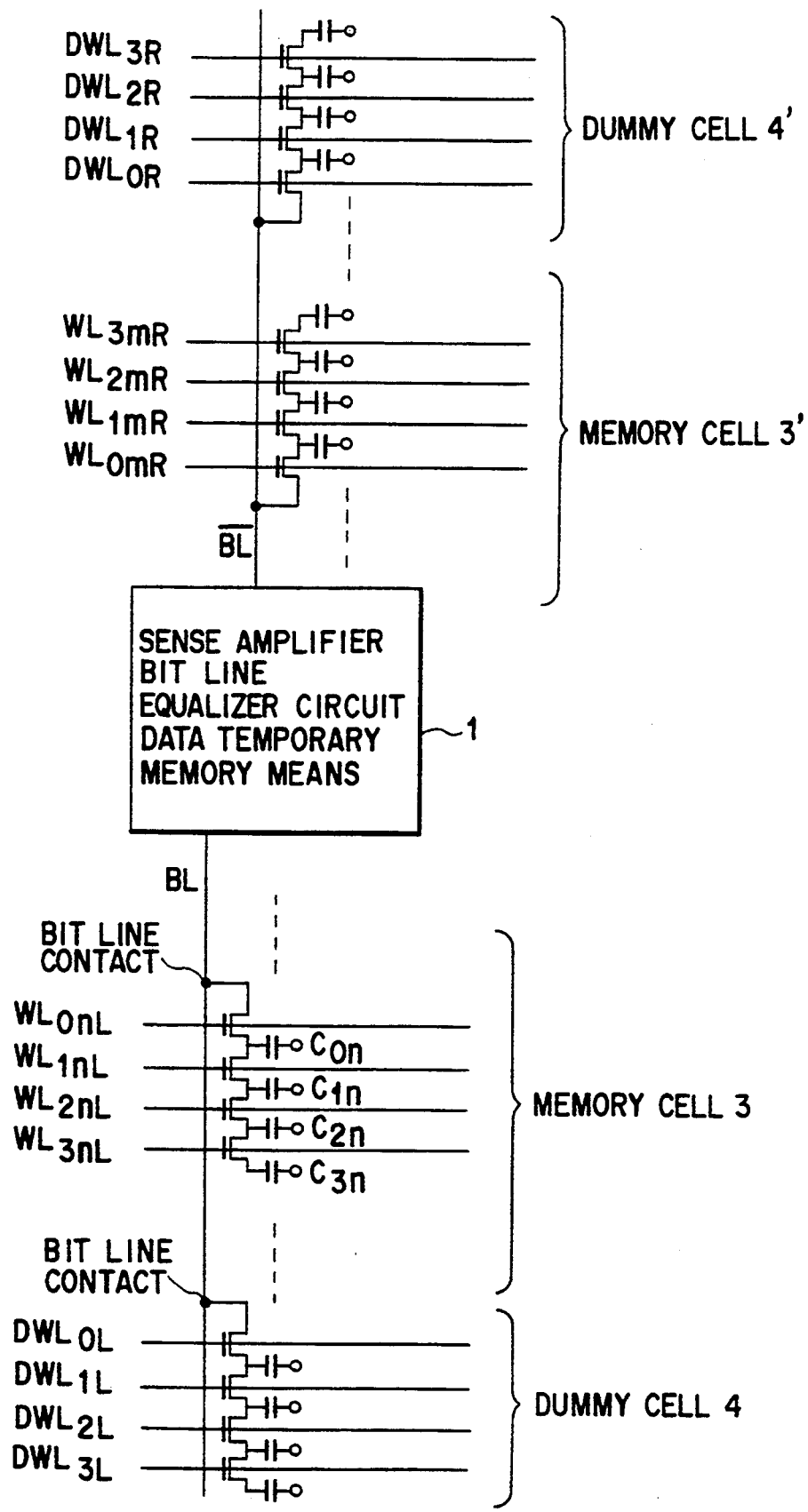
FIG. 13 is a circuit construction diagram showing a DRAM according to a sixth embodiment.
Figure 14:
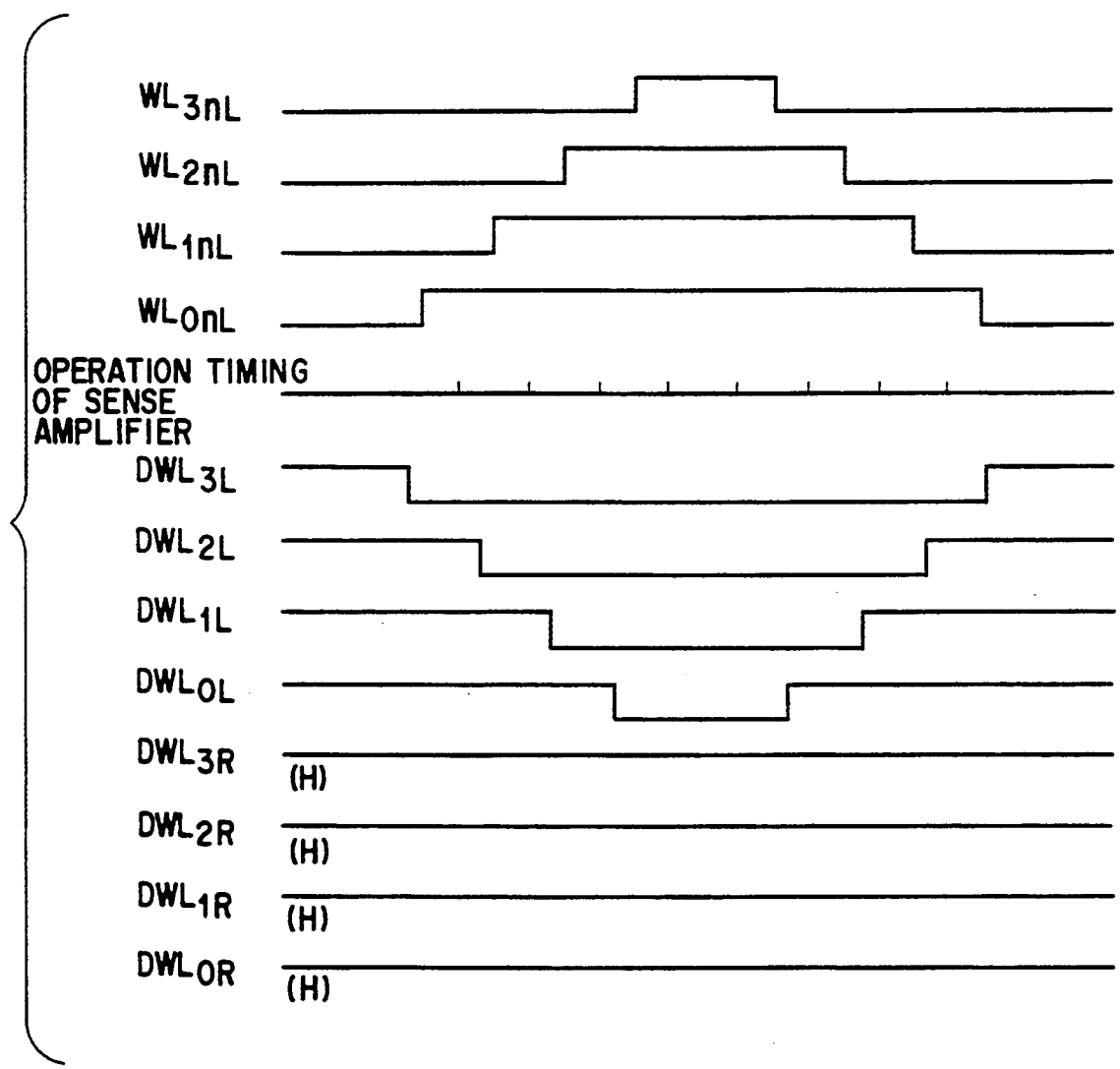
FIG. 14 is a timing chart of the sense amplifier in the sixth embodiment.

FIG. 13 is a circuit construction diagram showing a DRAM according to a sixth embodiment of this invention, and FIG. 14 is a timing chart of the sense amplifier in this embodiment. In the sixth embodiment, the number of series-connected memory cells is set to four but it can be set to a value other than 4. As shown in FIG. 13, bit lines BL and /BL are connected to both sides of a sense amplifier 1 and a plurality of NAND type memory cell units 3 are connected to each bit line. A dummy cell 4 having the same structure as the memory cell unit 3 is connected to the bit line BL. Four dummy word lines DWL are disposed on each side of the sense amplifier 1, and in the stand-by mode, all of the dummy word lines DWL are set in the raised state.

Assume now that the word lines WL$_{0nL}$ to WL$_{3nL}$ are sequentially selected and data items D$_{0nL}$ to D$_{3nL}$ of the memory cells C$_{0n}$ to C$_{3n}$ selected by the word lines WL$_{0nL}$ to WL$_{3nL}$ are accessed. FIG. 14 is a diagram showing the timing in the sixth embodiment.

When the potential of the word line WL$_{0nL}$ is raised, the potential of the dummy word line DWL$_{3L}$ connected to the same bit line BL is lowered. In this state, data D$_{0nL}$ of the first memory cell C$_{0n}$ is read out on the bit line, amplified by the sense amplifier 1 and stored into the data temporary memory means. At this time, the number of DRAM cells connected to the bit line BL is four in total including one memory cell and three dummy cells. On the other hand, the number of DRAM cells connected to the complementary bit line /BL is four including four dummy cells and the numbers of the DRAM cells connected to the respective paired bit lines are equal to each other.

When the potential of WL$_{1nL}$ rises, the potential of WL$_{2L}$ is lowered, and data D$_{1nL}$ of the second memory cell C$_{1n}$ is read out and temporarily stored. Also, in this state, the number of DRAM cells connected to the bit line BL is four in total including two memory cells and two dummy cells.

Figure 15:
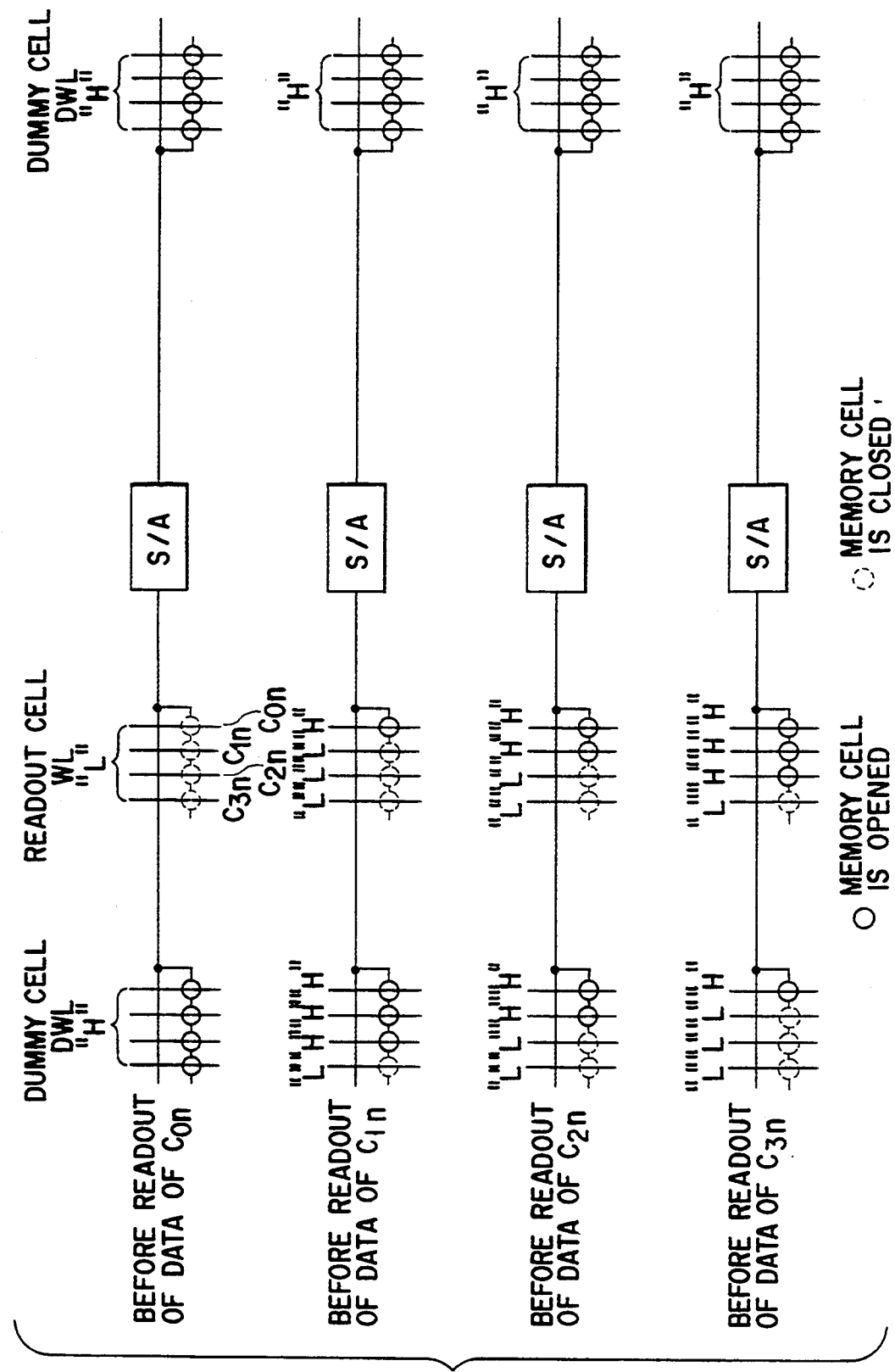
FIG. 15 is a diagram showing the states of a word line and a dummy word line in the sixth embodiment.

The potentials of the word lines WL$_{2nL}$, WL$_{3nL}$ are sequentially raised and the potentials of the dummy word lines DWL$_{1L}$, DWL$_{0L}$ are sequentially lowered, but the number of DRAM cells connected to the respective paired bit lines at each stage is always kept at the same value. This is shown in FIG. 15. In FIG. 15, circles of solid lines indicate memory cells which are set in the open state (which are not connected to the bit line) and circles of broken lines indicate memory cells which are set in the closed state (which are connected to the bit line).

Data read out from the data temporary memory means is written into the memory cell, the potentials of the word lines WL$_{3nL}$, WL$_{2nL}$, WL$_{1nL}$ and WL$_{0nL}$ are sequentially lowered in this order, and at the same time, the potentials of the dummy word lines DWL$_{0L}$, DWL$_{1L}$, DWL$_{2L}$ and DWL$_{0L}$ are sequentially raised in this order. Even at this time, the number of memory cells connected to each of the paired bit lines is kept at four.

In order to prevent an increase in the bit line capacitance when data of the memory cell is read out on the bit line, the potential of the dummy word line is lowered at a timing earlier than the timing of rise in the potential of a corresponding word line. In order to prevent the content of the dummy cell from flowing into the bit line and acting as the noise with respect to the write-in data for the memory cell, the potential of the dummy word line is raised at a timing later than the timing of fall in the potential of the word line.

As described above, in the sixth embodiment, the number of DRAM cells connected to each of the paired bit lines is always kept at four in a sequence of access operations so that the bit line capacitance can be kept in a balanced state, thereby making it possible to stably effect the circuit operation such as the sense amplifier operation.

Next, a seventh embodiment of this invention is explained. The seventh embodiment is an embodiment in which the access method for the NAND type DRAM is improved. In the following explanation, the number of series-connected DRAM cells is set to four, but it can be set to a value other than 4.

Figure 16:
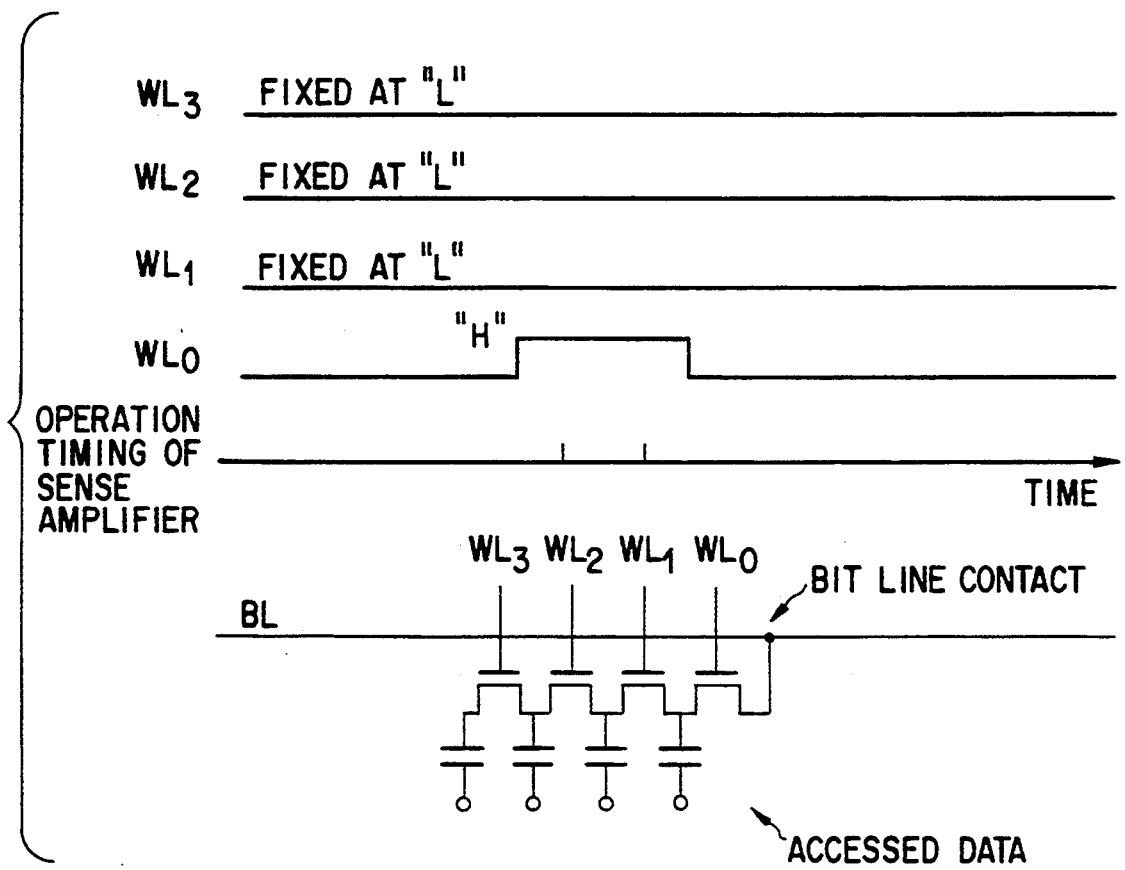
FIG. 16 is a diagram showing the timings set in a case where access is made to a first cell of a NAND cell in a seventh embodiment.
Figure 17:
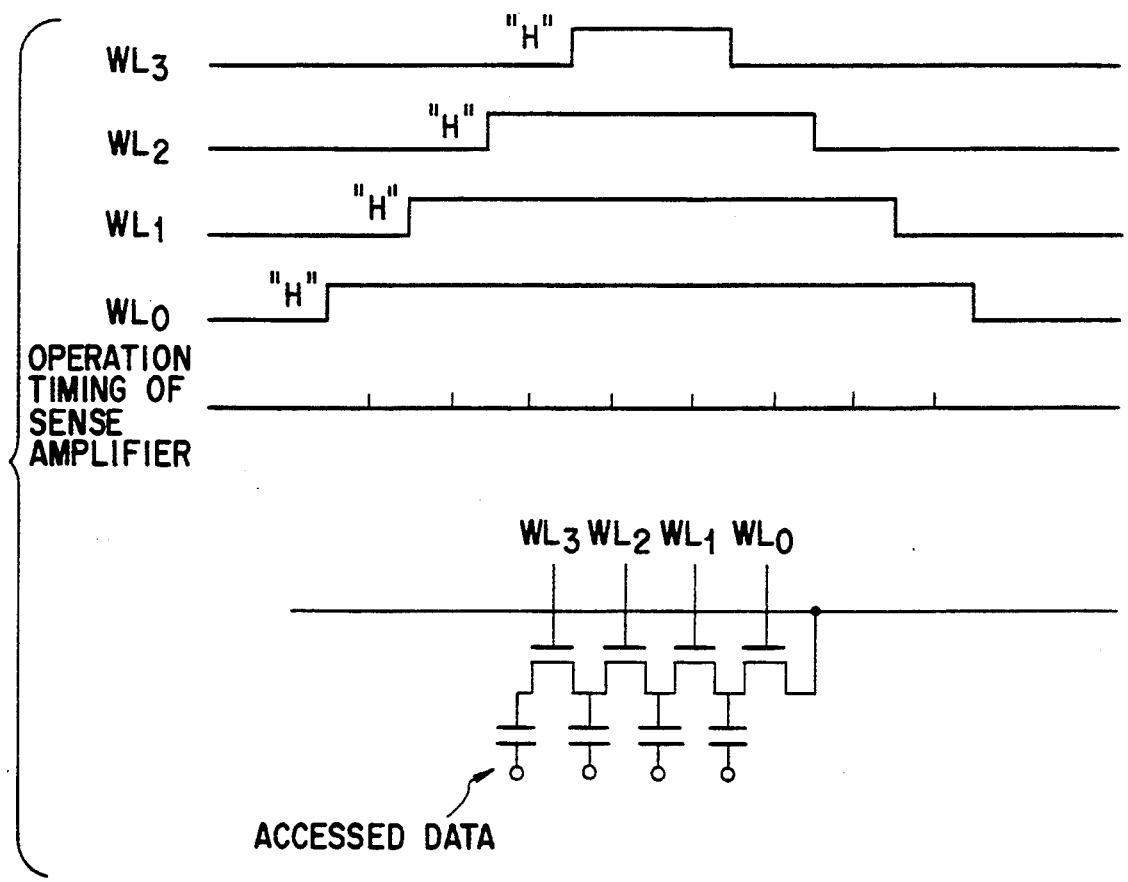
FIG. 17 is a diagram showing the timings set in a case where access is made to a forth cell of the NAND cell in the seventh embodiment.

FIG. 16 shows a case wherein access is made to a memory cell (first memory cell) which lies in the nearest position to the bit line contact. In this case, only one word line is driven, and the remaining three word lines are not driven. FIG. 17 shows a case wherein access is made to a memory cell (fourth memory cell) which lies in the farthest position from the bit line contact. In this case, all of the four word lines are sequentially driven like the conventional case.

Figure 18:
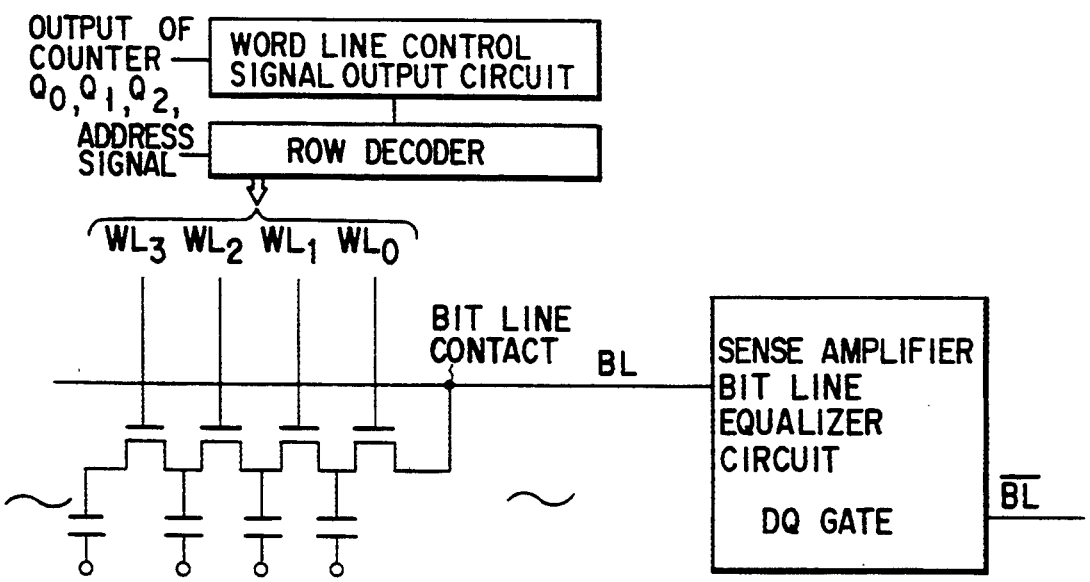
FIG. 18 is a circuit construction diagram showing a DRAM according to the seventh embodiment.
Figure 19:
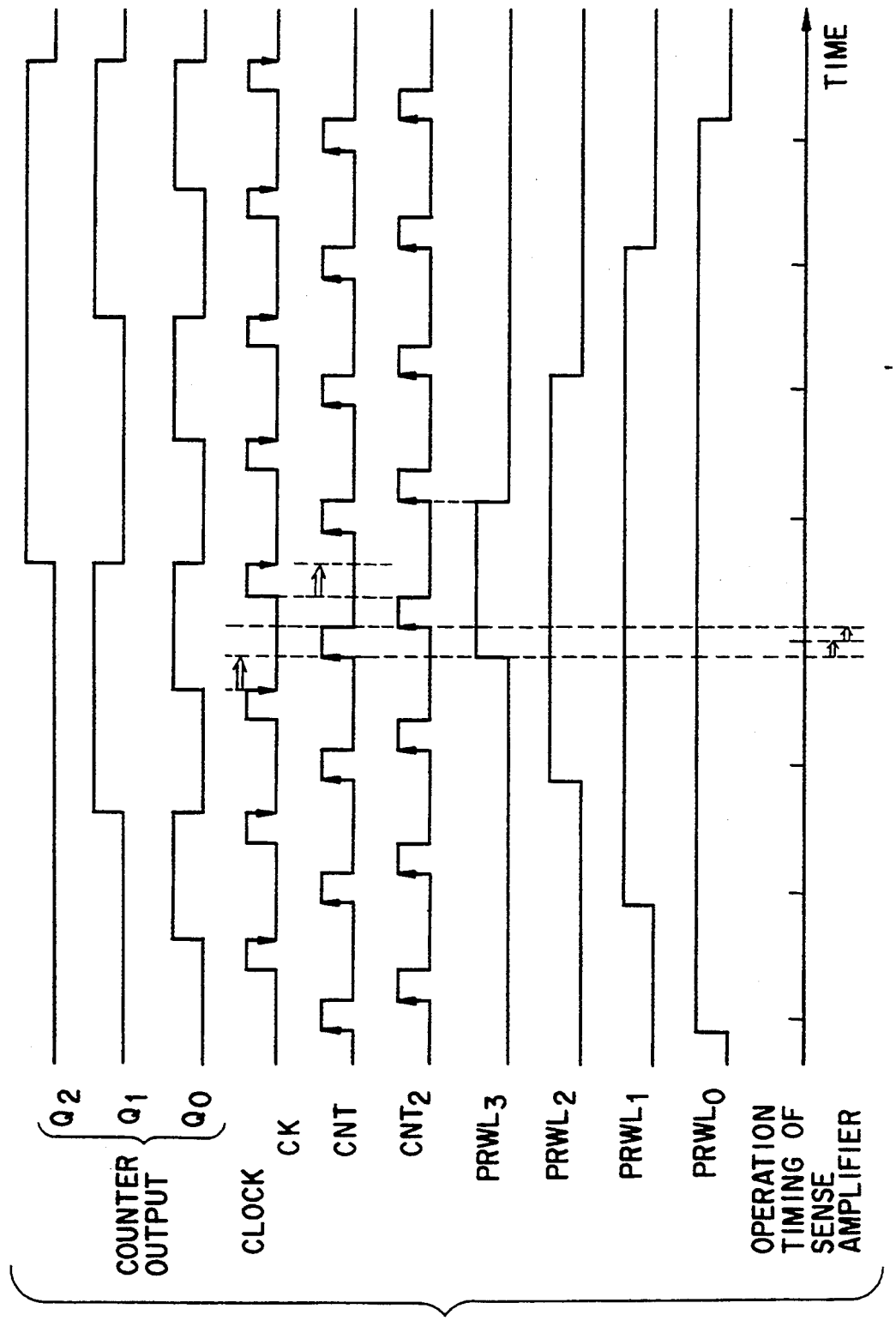
FIG. 19 is a diagram showing the relation between the operation timings of a sense amplifier for readout or rewrite-in of cell data.

FIG. 18 is a circuit construction diagram showing a DRAM according to the seventh embodiment of this invention. In the seventh embodiment, a 3-bit counter (not shown) is additionally provided in order to control four word lines WL$_0$, WL$_1$, WL$_2$ and WL$_3$. The relation between the values of counter outputs Q2, Q1, Q0 and the operation timing of the sense amplifier for reading out or writing cell data is shown in FIG. 19. FIG. 19 shows the operation timing in a case wherein all of the four word lines are selected.

The value of the counter output is sequentially increased in response to the fall of a clock signal CK. A pulse of the clock CK is generated each time the sense amplifier is operated once. Each word line is controlled by the counter output, and the potential of the word line WL$_0$ rises when the clock output Q2Q1Q0 is 000 (by the rise of the control signal CNT) and falls when the output is 111 (by the rise of the control signal CNT2). The potential of the word line WL$_1$ rises at the time of 001 and falls at the time of 110. Likewise, the potentials of the word lines WL$_2$ and WL$_3$ rise at the respective times of 010 and 011 and fall at the respective times of 101 and 100.

An example of a circuit for realizing the above operation is shown in FIG. 20. Word line control signals PRWL$_0$, PRWL$_1$, PRWL$_2$ and PRWL$_3$ created in the circuit of FIG. 20 are input to a row decoder and the word line WL$_0$, WL$_1$, WL$_2$ or WL$_3$ whose address is designated is driven.

Figure 21:
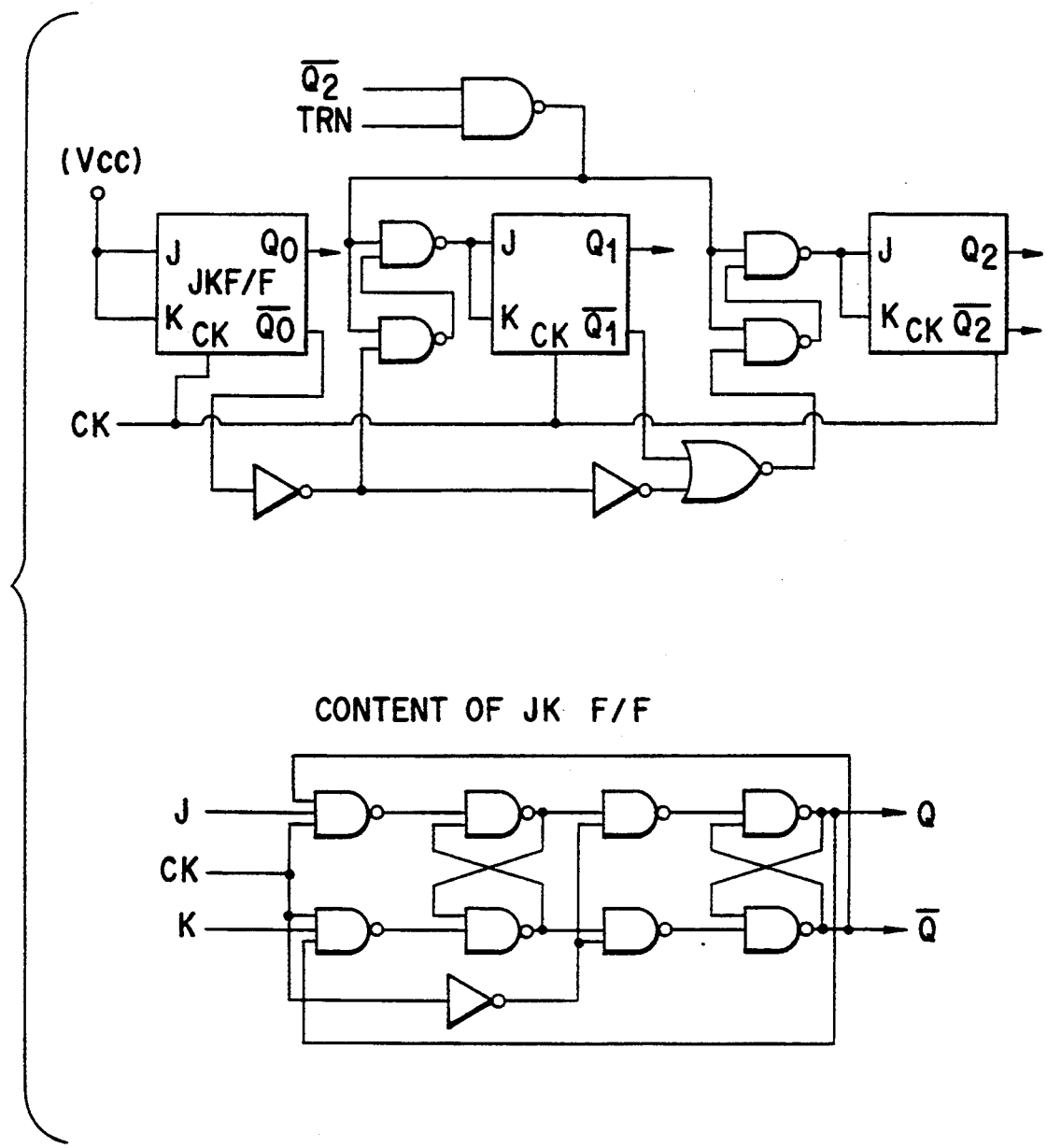
FIG. 21 is a diagram showing an example of a counter circuit used in the seventh embodiment.

FIG. 21 shows an example of the counter circuit used in the seventh embodiment. The counter circuit is constructed by three JK flip-flops and the value of the output Q2Q1Q0 increases in response to the fall of the clock CK.

In addition, a control signal TRN is input, and when the TRN signal is at the "L" level, the value of the counter output monotonously increases. However, if the TRN signal is set to the "H" level when the output is set at 000, 001, 010 or 011 (before the CK signal rises), the upper two bits (Q2, Q1) are forcedly inverted when next counter output is incremented, and if the TRN signal is set to the "H" level when the output is set at 000, the next output becomes 111, when the output is set at 001, the next output becomes 110, when the output is set at 101, the next output becomes 101, when the output is set at 011, the next output becomes 100, and thus the counter output rapidly increases.

In a case where the word lines are controlled by use of the above counter, the counter output is set from 000 to 111 if the TRN signal is changed from the "L" level to the "H" level when the potential of the word line $WL_0$ rises (before CK is set to the "H" level when the counter output is set at 000) so that the operation of lowering the potential of the word line $WL_0$ will be next effected. Therefore, the cycles of raising and lowering the potentials of the other three word lines $WL_1$, $WL_2$ and $WL_3$ are omitted and it becomes possible to raise or lower only the potential of the word line $WL_0$.

Likewise, it becomes possible to omit the operation of raising and lowering the potentials of the word lines $WL_2$, $WL_3$ and effect the operation of sequentially raising or lowering the potentials of the word lines $WL_0$, $WL_1$ by setting the TRN signal to the "H" level when the counter output is set at 001. Likewise, it becomes possible to effect the operation of selecting only $WL_0$, $WL_1$, $WL_2$.

As described above, according to the seventh embodiment, since the number of selected word lines in the NAND type DRAM cell can be freely controlled, an increase in the average cycle time and power consumption caused by operating unnecessary word lines can be suppressed to a minimum.

When the operation is controlled based on the timings, the number of selected word lines can be freely set from the exterior by inputting the clock signal CK as a control signal from the exterior and inputting a/RAS signal (row address strobe signal) as the TRN signal to change the pulse length of the /RAS signal corresponding to the number of the CK signals.

On the other hand, when only the fixed potential is controlled by a control signal without using the timings, the number of selected word lines can be controlled by use of the control signal by supplying an external input signal (control signal) which is fixed at the "H" or "L" level in a cycle in which the number of word lines whose potential should be raised is controlled.

This invention is not limited to the above embodiments and can be variously modified without departing from the technical scope thereof. For example, the open bit line configuration is explained in the above embodiments, but this invention can also be applied to the folded bit line configuration.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
   a plurality of memory cells;
   a plurality of bit lines respectively connected to said memory cells;
   a plurality of sense amplifiers, connected to corresponding bit line groups including predetermined number of bit lines of said plurality of bit lines, for reading out data of memory cells connected to bit lines of said bit line group, said bit line groups including at least adjacent first and second bit line groups;
   at least first and second transistors allocated between said bit lines and said sense amplifiers thereto and having gates, for selectively connecting said bit lines and said sense amplifiers; and
   a plurality of control signal lines commonly connected to said first transistors connected to said first bit line groups and said second transistors connected to said second bit line groups, wherein
   said first transistors connected to said first bit line groups are regularly arranged from given direction, and said second transistors connected to said second bit line groups adjacent to said first bit line groups are regularly arranged from opposite direction thereof.

2. A semiconductor memory device according to claim 1, wherein said memory cells includes memory cell units including a plurality of memory cells connected in series, and said memory cell units are connected to the corresponding bit lines.

3. A semiconductor memory device according to claim 1, further comprising write-in means for writing data to said bit lines at least twice.

4. A semiconductor memory device according to claim 3, wherein said write-in means includes means for omitting the second and succeeding writing operations for the bit line into which data is last written in the first cycle.

5. A semiconductor memory device according to claim 1, wherein adjacent two of said bit lines are respectively connected to two of said sense amplifiers which are operated at different timings.

6. A semiconductor memory device according to claim 1, wherein said first and said second transistors are symmetrically arranged for adjacent bit line groups.

7. A semiconductor memory device comprising:
   a plurality of memory cells;
   a plurality of bit line groups including a predetermined number of bit lines connected to said memory cells, said bit line groups including at least adjacent first and second bit line groups;
   first and second sense amplifiers each connected to at least two bit lines of said bit line groups, adjacent bit lines connected to different sense amplifiers, respectively;
   at least first and second transistors arranged said plurality of bit lines and having gates, for selectively connecting said bit lines and said sense amplifiers; and
   a plurality of control signal lines commonly connected to said first transistors connected to said first bit line groups and said second transistors connected to said second bit line groups, wherein said first transistors connected to said first bit line groups are regularly arranged from given direction, and second transistor connected to said second bit line groups adjacent to said first bit line groups are regularly arranged from opposite direction thereof.

8. A semiconductor memory device according to claim 7, wherein said first and said second transistors are symmetrically arranged for adjacent bit line groups.

9. A semiconductor memory device according to claim 7, wherein said memory cells includes memory cell units including a plurality of memory cells connected in series, and said memory cell units are connected to the corresponding bit lines.

10. A semiconductor memory device comprising:
a plurality of memory cells;
a plurality of bit line groups each having a predetermined number of bit lines connected to said memory cells, said bit line groups including at least adjacent first and second bit line groups;
a plurality of sense amplifiers connected to the corresponding bit line groups including first end bit lines and second end bit lines, for reading out data of memory cells connected to the bit lines of said bit line groups; and
means for simultaneously effecting write-in operation of said first end bit line of said first bit line groups and said second end bit line of said second bit line groups adjacent thereto and effecting write-in operation of bit line except said first end bit line and said second end bit line with at least one adjacent bit line for which the write-in operation is already effected.

11. A semiconductor memory device comprising:
a plurality of memory units including a plurality of memory cells connected in series;
a plurality of bit lines;
a plurality of word lines connected to said plurality of memory cell units;
a sense amplifier connected to said bit lines, for reading out data of said memory cells of said memory cell units connected to the corresponding bit lines;
a plurality of dummy cell units connected to said bit lines and including a plurality of dummy cells connected in series, each said dummy cell having a gate;
a plurality of dummy word lines connected the gates of said plurality of dummy memory cells;
means for activating all said dummy word lines in waiting state; and
means for sequentially deactivating said dummy word lines far from bit line contacts for sequentially activating said word lines connected to said memory cell units near from the bit line contact in a reading operation.

12. A semiconductor memory device according to claim 11, further comprising means for sequentially activating said dummy word lines near from bit line contacts for sequentially deactivating said word lines connected to said memory cell units far from the bit line contact in a rewrite operation of said memory cell.

13. A semiconductor memory device according to claim 11, further comprising reference bit lines arranged opposite side of said bit lines for said sense amplifiers, wherein said dummy cell units are connected said reference bit lines.

14. A semiconductor memory device according to claim 13, wherein selecting operation of at least one of said word lines and dummy word lines is controlled to equalize the number of at least one of all said memory cells and all said dummy memory cells connected said bit lines by the selecting operation with the number of said dummy memory cells connected to said reference bit lines.

15. A semiconductor memory device comprising:
a plurality of memory cell units including a plurality of memory cells connected in series, said memory cells having gates;
a plurality of bit lines connected to said plurality of memory cell units;
a plurality of word lines connected to the gates of said plurality of said memory cells;
a sense amplifier connected to said bit lines, for reading out data of said memory cells of said memory cell units connected to the corresponding bit lines;
means for sequentially activating said word lines connected to said memory cell units from the word lines connected to memory cells near bit line contacts to the word lines connected to selected memory cells in one of read-out and write-in operation of the data of the selected memory cells of said memory cell units;
means for preventing from activating the word lines connected to memory cells further than said selected memory cells from the bit line contacts; and
means for sequentially deactivating the word line connected to said selected memory cells to the word lines connected to memory cells near the bit line contacts.

* * * * *